(12) United States Patent
Yoo et al.

(10) Patent No.: US 9,660,139 B2
(45) Date of Patent: May 23, 2017

(54) NANOSTRUCTURE SEMICONDUCTOR LIGHT EMITTING DEVICE

(71) Applicant: Samsung Electronics Co., Ltd., Suwon-si, Gyeonggi-do (KR)

(72) Inventors: Geon Wook Yoo, Seongnam-si (KR); Kyung Wook Hwang, Hwaseong-si (KR); Yong Min Kim, Hwaseong-si (KR); Sung Hyun Sim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/018,026

(22) Filed: Feb. 8, 2016

(65) Prior Publication Data

US 2016/0155897 A1    Jun. 2, 2016

Related U.S. Application Data

(62) Division of application No. 14/605,551, filed on Jan. 26, 2015, now Pat. No. 9,287,446.

(30) Foreign Application Priority Data

Mar. 27, 2014  (KR) .................. 10-2014-0036132

(51) Int. Cl.
*H01L 33/00* (2010.01)
*H01L 33/06* (2010.01)
(Continued)

(52) U.S. Cl.
CPC .............. *H01L 33/06* (2013.01); *B82Y 20/00* (2013.01); *H01L 33/0025* (2013.01);
(Continued)

(58) Field of Classification Search
CPC ......... H01L 33/18; H01L 33/08; H01L 33/06; H01L 33/24; H01L 33/145; H01L 33/52;
(Continued)

(56) References Cited

U.S. PATENT DOCUMENTS 6,372,608 B1   4/2002  Shimoda et al.
6,645,830 B2  11/2003  Shimoda et al.
(Continued)

FOREIGN PATENT DOCUMENTS

WO    WO-2010014032 A1    2/2010

*Primary Examiner* — Nikolay Yushin
(74) *Attorney, Agent, or Firm* — Harness, Dickey & Pierce, P.L.C.

(57) ABSTRACT

A nanostructure semiconductor light emitting device includes a base layer, an insulating layer, a plurality of light emitting nanostructures, and a contact electrode. The base layer is formed of a first conductivity-type semiconductor material. The insulating layer is disposed on the base layer. Each light emitting nanostructure is disposed in a respective opening of a plurality of openings in the base layer, and includes a nanocore formed of the first conductivity-type semiconductor material, and an active layer and a second conductivity-type semiconductor layer sequentially disposed on a surface of the nanocore. The contact electrode is spaced apart from the insulating layer and is disposed on a portion of the second conductivity-type semiconductor layer. A tip portion of the light emitting nanostructure has crystal planes different from those on side surfaces of the light emitting nanostructure.

18 Claims, 20 Drawing Sheets

(51) Int. Cl.
  *H01L 33/18* (2010.01)
  *H01L 33/08* (2010.01)
  *H01L 33/14* (2010.01)
  *B82Y 20/00* (2011.01)
  *H01L 33/24* (2010.01)
  *H01L 33/52* (2010.01)

(52) U.S. Cl.
  CPC ............ *H01L 33/08* (2013.01); *H01L 33/145* (2013.01); *H01L 33/18* (2013.01); *H01L 33/24* (2013.01); *H01L 33/52* (2013.01); *H01L 2224/16245* (2013.01); *H01L 2224/48091* (2013.01); *H01L 2224/48227* (2013.01); *H01L 2924/181* (2013.01)

(58) Field of Classification Search
  CPC ........... H01L 33/0025; H01L 2924/181; H01L 2924/00014; H01L 2924/00012; H01L 2224/48091; H01L 2224/48227; H01L 2224/16245; B82Y 20/00
  See application file for complete search history.

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,132,677 B2 | 11/2006 | Kim et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,521,274 B2 | 4/2009 | Hersee et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,350,249 B1 * | 1/2013 | Svensson ............ H01L 29/0676 257/13 |
| 8,350,251 B1 | 1/2013 | Lowgren et al. |
| 8,399,944 B2 | 3/2013 | Kwak et al. |
| 8,410,496 B2 | 4/2013 | Hersee et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,669,574 B2 | 3/2014 | Konsek et al. |
| 8,735,931 B2 | 5/2014 | Han et al. |
| 8,766,295 B2 | 7/2014 | Kim |
| 8,835,903 B2 | 9/2014 | Gwo et al. |
| 8,847,199 B2 | 9/2014 | Cha et al. |
| 8,895,958 B2 * | 11/2014 | Fukui ................ H01L 21/02488 257/12 |
| 9,054,233 B2 * | 6/2015 | Ohlsson ............ H01L 33/0062 |
| 9,166,106 B2 * | 10/2015 | Svensson ............. H01L 33/007 |
| 2005/0194598 A1 | 9/2005 | Kim et al. |
| 2011/0309382 A1 | 12/2011 | Lowgren |
| 2012/0153252 A1 | 6/2012 | Kim et al. |
| 2012/0223289 A1 | 9/2012 | Gwo et al. |
| 2012/0235117 A1 | 9/2012 | Fukui et al. |
| 2013/0092899 A1 | 4/2013 | Svensson |
| 2013/0099199 A1 | 4/2013 | Cha et al. |
| 2013/0112944 A1 | 5/2013 | Cha et al. |
| 2013/0140521 A1 | 6/2013 | Gilet et al. |
| 2013/0248817 A1 | 9/2013 | Kim |
| 2014/0117307 A1 | 5/2014 | Herner et al. |
| 2014/0138620 A1 * | 5/2014 | Svensson ............. H01L 33/007 257/13 |

* cited by examiner

NANOSTRUCTURE SEMICONDUCTOR LIGHT EMITTING DEVICE

CROSS-REFERENCE TO RELATED APPLICATION

This application is a divisional application of U.S. application Ser. No. 14/600,551, filed on Jan. 26, 2015, which claims priority under 35 U.S.C. §119 to Korean Patent Application No. 10-2014-0036132, filed on Mar. 27, 2014, with the Korean Intellectual Property Office, the entire disclosure of which is incorporated herein by reference.

BACKGROUND

The present disclosure relates to a three-dimensional nanostructure semiconductor light emitting device.

In recent years, as a new type of semiconductor light emitting diode (LED) technology, light emitting devices using nanostructures have been developed. Light emitting devices using nanostructures may have highly improved crystallinity, and may obtain an active layer from a non-polar plane or a semi-polar plane to thereby prevent luminous efficiency from deteriorating due to polarization. In addition, such nanostructure light emitting devices can emit light through a wide range of surface area, resulting in highly improved luminous efficiency.

SUMMARY

An aspect of the present disclosure may provide a nanostructure semiconductor light emitting device having a novel three-dimensional nanostructure in which current density distribution and light extraction efficiency are improved, resulting in improved luminous efficiency.

According to an exemplary embodiment, a nanostructure semiconductor light emitting device may include a base layer, an insulating layer, a plurality of light emitting nanostructures, and a contact electrode. The base layer is formed of a first conductivity-type semiconductor material. The insulating layer is disposed on the base layer and has a plurality of openings. The plurality of light emitting nanostructures are each disposed in an opening of the plurality of openings, and each light emitting nanostructure includes a nanocore formed of the first conductivity-type semiconductor material, and an active layer and a second conductivity-type semiconductor layer sequentially disposed on a surface of the nanocore. The contact electrode is spaced apart from the insulating layer and is disposed on a portion of the second conductivity-type semiconductor layer. A tip portion of the light emitting nanostructure has crystal planes different from those on side surfaces of the light emitting nanostructure.

A distance between the contact electrode and the insulating layer may be greater than approximately 50% of a height of the light emitting nanostructure measured from a surface of the insulating layer. The light emitting nanostructure may have an aspect ratio (height:width) of 2:1 or higher where the width of the light emitting nanostructure is measured along a surface of the insulating layer and a height of the light emitting nanostructure is measured perpendicularly from the surface of the insulating layer.

The contact electrode may be disposed to cover the tip portion of the light emitting nanostructure.

The nanostructure semiconductor light emitting device may further include a current blocking intermediate layer disposed in the tip portion of the light emitting nanostructure in at least one of a region between the active layer and the nanocore and a region between the active layer and the second conductivity-type semiconductor layer to suppress a flow of current passing through the active layer in the tip portion of the light emitting nanostructure.

The contact electrode may not be disposed on the tip portion of the light emitting nanostructure and may be disposed on the side surfaces of the light emitting nanostructure.

The contact electrode disposed on the side surfaces of the light emitting nanostructure may be extended to a top portion of the side surfaces of the light emitting nanostructure adjacent to the tip portion of the light emitting nanostructure.

The contact electrode may be spaced apart from the tip portion of the light emitting nanostructure by a predetermined distance, and the distance may be less than approximately 10% of a height of the light emitting nanostructure. The tip portion of the light emitting nanostructure may have a non-planarized surface.

The nanostructure semiconductor light emitting device may further include an insulating protective layer filling a space between the plurality of light emitting nanostructures and contacting lower regions of the plurality of light emitting nanostructures. The contact electrode may be disposed on the insulating protective layer.

The crystal planes on the side surfaces of the light emitting nanostructure may be perpendicular to an upper surface of the base layer.

The contact electrode may include a plurality of contact electrodes spaced apart from one another in a height direction of the light emitting nanostructure. Here, the light emitting nanostructure may have an aspect ratio (height:width) of 10:1 or higher.

The contact electrode may be a thick film that fills a portion of the spaces between the light emitting nanostructures.

According to another exemplary embodiment, a nanostructure semiconductor light emitting device may include a base layer, a plurality of light emitting nanostructures, and a contact electrode. The base layer is formed of a first conductivity-type semiconductor material. The plurality of light emitting nanostructures are disposed on the base layer, and each light emitting nanostructure includes a nanocore formed of the first conductivity-type semiconductor material, and an active layer and a second conductivity-type semiconductor layer sequentially disposed on a surface of the nanocore. The contact electrode is spaced apart from the base layer and is disposed on a portion of the second conductivity-type semiconductor layers which is higher than half of a height of the light emitting nanostructures.

The light emitting nanostructures can have planarized upper surfaces.

According to another exemplary embodiment, a nanostructure semiconductor light emitting device may include a base layer, an insulating layer, a plurality of light emitting nanostructures, and a contact electrode. The base layer is formed of a first conductivity-type semiconductor material. The insulating layer is disposed on the base layer and has a plurality of openings. Each light emitting nanostructure is disposed in an opening of the plurality of openings of the base layer, and includes a nanocore formed of the first conductivity-type semiconductor material, and an active layer and a second conductivity-type semiconductor layer sequentially disposed on a surface of the nanocore. The contact electrode is disposed on lower regions of side surfaces of the light emitting nanostructures adjacent to the insulating layer.

The contact electrode may not cover upper regions of the light emitting nanostructures adjacent to tips of the light emitting nanostructures. An insulating protective layer may fill a space between the plurality of light emitting nanostructures and may contact upper regions of the plurality of light emitting nanostructures, and tip portions of the light emitting nanostructures may be exposed through the insulating protective layer.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
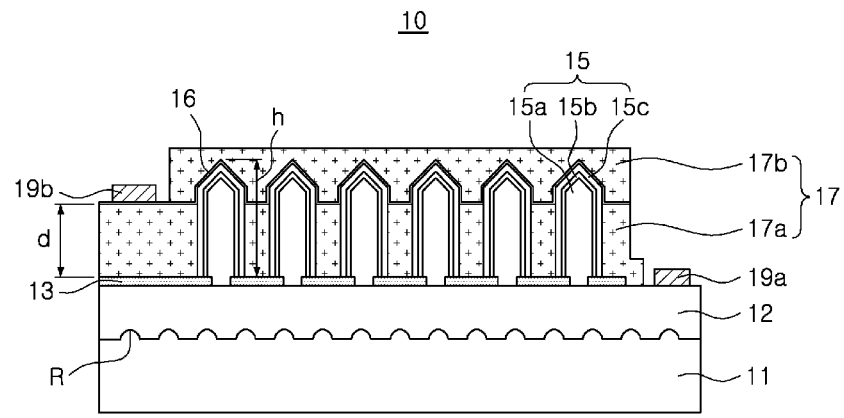
FIG. 1 is a cross-sectional view of a nanostructure semiconductor light emitting device according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

FIG. 1 is a cross-sectional view of a nanostructure semiconductor light emitting device according to an exemplary embodiment of the present disclosure.

A nanostructure semiconductor light emitting device 10 illustrated in FIG. 1 may include a base layer 12 formed of a first conductivity-type semiconductor material and a plurality of light emitting nanostructures 15 disposed on the base layer 12. In addition, the nanostructure semiconductor light emitting device 10 may include a substrate 11 having an upper surface on which the base layer 12 is disposed.

A convex pattern R may be formed on the upper surface of the substrate 11. Uneven portions of the convex pattern R may improve light extraction efficiency and the quality of a single crystal grown thereon. The substrate 11 may be an insulating substrate, a conductive substrate, or a semiconductor substrate. For example, the substrate 11 may be formed of sapphire, SiC, Si, $MgAl_2O_4$, MgO, $LiAlO_2$, $LiGaO_2$, or GaN.

The base layer 12 may provide a growth surface for the light emitting nanostructures 15. The base layer 12 may be formed of a nitride semiconductor containing $Al_xIn_yGa_{1-x-y}N$ ($0 \leq x < 1$, $0 \leq y < 1$, and $0 \leq x+y < 1$) and may be doped with impurities. For example, the base layer 12 may be doped with n-type impurities such as silicon (Si).

An insulating layer 13 having openings H may be formed on the base layer 12 and the openings may be provided for growth of the light emitting nanostructures 15 (especially, nanocores 15a). The base layer 12 may be exposed through the openings H and nanocores 15a may be formed on exposed portions of the base layer 12. The insulating layer 13 may be used as a mask for growth of the nanocores 15a. The insulating layer 13 may be formed of an insulating material such as $SiO_2$ or $SiN_x$.

The light emitting nanostructures 15 may each include the nanocore 15a formed of the first conductivity-type semiconductor, and an active layer 15b and a second conductivity-type semiconductor layer 15c sequentially formed on a surface of the nanocore 15a. The nanocore 15a may be formed of a nitride semiconductor containing $Al_xIn_yGa_{1-x-y}N$ ($0 \leq x < 1$, $0 \leq y < 1$, and $0 \leq x+y < 1$), similar to the base layer 12. For example, the nanocore 15a may be formed of n-type GaN. The active layer 15b may have a multi-quantum well (MQW) structure in which quantum well layers and quantum barrier layers are alternately stacked. For example, in the case in which the active layer 15b is formed of a nitride semiconductor, the active layer 15b may have a GaN/InGaN MQW structure. As necessary, the active layer 15b may have a single quantum well (SQW) structure. The second conductivity-type semiconductor layer 15c may be a crystal containing p-type $Al_xIn_yGa_{1-x-y}N$ ($0 \leq x < 1$, $0 \leq y < 1$, and $0 \leq x+y < 1$), and may be formed of a plurality of layers as necessary.

Figure 2A:
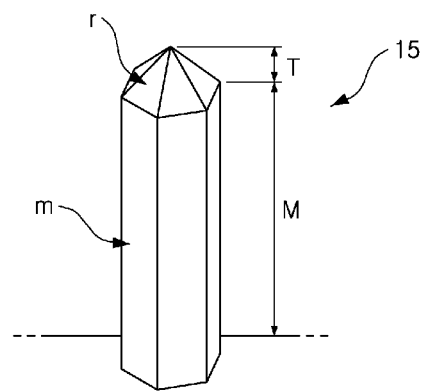
FIGS. 2A and 2B are schematic perspective views illustrating examples of nanocores usable in the exemplary embodiment of FIG. 1.

As illustrated in FIG. 2A, the light emitting nanostructure 15 may include a main portion M having a hexagonal prism structure and a tip portion T disposed on the top of the main portion M. The main portion M of the light emitting nanostructure 15 may have side surfaces which are a first family of crystal planes (e.g., m-planes) and the tip portion T of the light emitting nanostructure 15 may have facets which are a second family of crystal planes (e.g., r-planes) different from the first family of crystal planes. The tip portion T of the light emitting nanostructure 15 may have a hexagonal pyramid structure.

The shape of the light emitting nanostructure 15 and the crystal planes thereof may be determined depending on the shape of the nanocore 15a and the crystal planes thereof. The light emitting nanostructure 15 usable in the present exemplary embodiment may be changed to have various forms. That is, the light emitting nanostructure 15 may have different shapes and different crystal planes according to a shape of the grown nanocore or postprocessing.

Figure 2B:
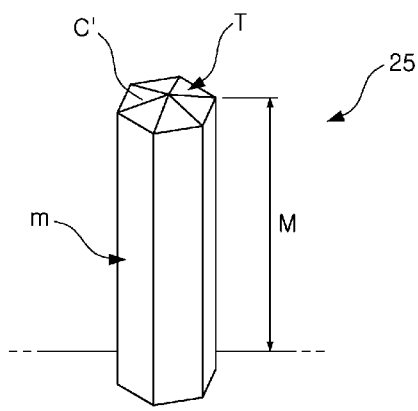

For example, as illustrated in FIG. 2B, a main portion M of a light emitting nanostructure 25 may have side surfaces which are a first family of crystal planes (m-planes), and a tip portion T thereof may have a second family of crystal planes C' different from the first family of crystal planes. The second family of crystal planes C' may not be completely semi-polar. In some embodiments, an upper surface of the light emitting nanostructure may be flat as a result of being subjected to a planarization process or the like.

The nanostructure semiconductor light emitting device 10 may include a contact electrode 16 connected to the second conductivity-type semiconductor layer 15c. The contact electrode 16 may be spaced apart from the insulating layer 13 to be disposed on portions of the second conductivity-type semiconductor layer 15c.

As illustrated in FIG. 1, the contact electrode 16 may not cover lower regions of the light emitting nanostructures 15, but may be disposed to cover upper regions of the light emitting nanostructures 15. In the present exemplary embodiment, the contact electrode 16 may be disposed to cover the tip portions of the light emitting nanostructures 15.

Due to such disposition of the contact electrode 16, current may be supplied to ends of the light emitting nanostructures 15. Since the contact electrode 16 is not disposed on regions of the light emitting nanostructures 15 adjacent to the base layer 12, relatively uniform current density distribution may be obtained throughout the entirety of the light emitting nanostructures 15, whereby current concentration may be alleviated. Details thereof will be provided with reference to FIGS. 3A through 3C, 4A, and 4B.

A distance d between the contact electrode 16 and the insulating layer 13 may be equal to or greater than half of a height h of the light emitting nanostructure 15. In some embodiments, the distance d may be greater than 70% of the height h of the light emitting nanostructure 15.

As the height h of the light emitting nanostructure 15 is increased, non-uniformity in current density distribution in a height direction of the light emitting nanostructure 15 may become worse. The disposition of the contact electrode 16 according to the present exemplary embodiment may be useful in reducing non-uniformity in current density distribution for the light emitting nanostructure 15 having a relatively high aspect ratio. For example, the light emitting nanostructure 15 may have an aspect ratio (height:width) of 2:1 or higher. In some embodiments, the aspect ratio of the light emitting nanostructure 15 may be 3:1 or higher, or may be 5:1 or higher.

The contact electrode 16 used in the present exemplary embodiment may include an ohmic-contact material making ohmic-contact with the second conductivity-type semiconductor layer 15c. For example, the contact electrode 16 may include at least one of silver (Ag), nickel (Ni), aluminum (Al), rhodium (Rh), palladium (Pd), iridium (Ir), ruthenium (Ru), magnesium (Mg), zinc (Zn), platinum (Pt), and gold (Au), and may have a single layer structure or a multilayer structure. The contact electrode 16 may be formed of a transparent conductive material, but is not limited thereto. The contact electrode 16 may be formed of a transparent conductive oxide layer or a transparent conductive nitride layer in order to direct light towards the light emitting nanostructures in a direction opposite to the substrate. For example, the contact electrode 16 may include at least one selected from the group consisting of indium tin oxide (ITO), zinc-doped indium tin oxide (ZITO), zinc indium oxide (ZIO), gallium indium oxide (GIO), zinc tinoxide (ZTO), fluorine-doped tin oxide (FTC)), aluminum-doped zinc oxide (AZO), gallium-doped zinc oxide (GZO), $In_4Sn_3O_{12}$, and zinc magnesium oxide ($Zn_{(1-x)}Mg_xO$, where $0 \leq x \leq 1$). As necessary, the contact electrode 16 may include graphene.

As illustrated in FIG. 1, the disposition of the contact electrode 16 may be facilitated by forming an insulating protective layer 17 to have a division between first and second insulating protective layers 17a and 17b. The insulating protective layer 17 may include the first insulating protective layer 17a filling a portion of spaces between the plurality of light emitting nanostructures 15, and the second insulating protective layer 17b filling a remaining portion of the spaces between the plurality of light emitting nanostructures 15, while encapsulating the plurality of light emitting nanostructures 15.

The distance d between the contact electrode 16 and the insulating layer 13 may be determined depending on a thickness of the first insulating protective layer 17a. That is, the upper regions of the light emitting nanostructures 15 connected to the contact electrode 16 may be determined depending on a height up to which the first insulating protective layer 17a is formed. The contact electrode 16 may be connected to the upper regions of the light emitting nanostructures 15 and may be disposed on the first insulating protective layer 17a. The first insulating protective layer 17a may be disposed to contact the lower regions of the light emitting nanostructures 15, thereby preventing the lower regions of the light emitting nanostructures 15 from being connected to the contact electrode 16.

The insulating protective layer 17 may serve as a passivation layer protecting the light emitting nanostructures 15. The insulating protective layer 17 may be formed of a light transmissive material.

At least one of the first and second insulating protective layers 17a and 17b may include an insulating material such as an oxide, a nitride, or the like. For example, the first insulating protective layer 17a may include tetraethylorthosilane (TEOS), borophospho silicate glass (BPSG), CVD-SiO$_2$, spin-on glass (SOG), or spin-on dielectric (SOD). The second insulating protective layer 17b may be formed of a material similar to that of the first insulating protective layer 17a.

In some embodiments, at least one of the first and second insulating protective layers 17a and 17b may include a polymer-based resin. For example, at least one resin selected from an epoxy resin, a Si resin, a polyethylene resin, and a polycarbonate resin may be used.

The nanostructure semiconductor light emitting device 10 may include first and second electrodes 19a and 19b. The first electrode 19a may be disposed on an exposed region of the base layer 12 formed of the first conductivity-type semiconductor. In addition, the second electrode 19b may be disposed on an extended and exposed region of the contact electrode 16.

Figure 3A:
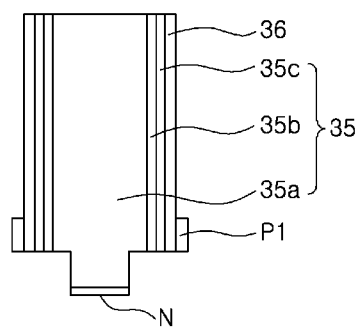
FIGS. 3A through 3C are schematic cross-sectional views of light emitting nanostructures having different electrode arrangements.
Figure 3B:
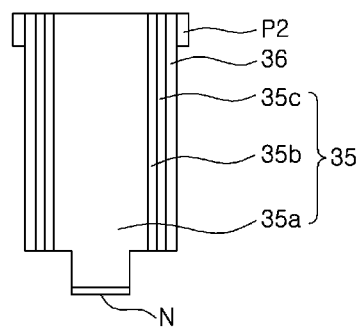
Figure 3C:
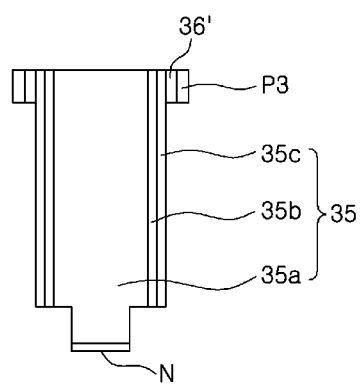

Detailed operations and effects according to the present exemplary embodiment will be described with reference to FIGS. 3A through 3C. FIGS. 3A through 3C are schematic cross-sectional views of light emitting nanostructures having different electrode arrangements.

Light emitting nanostructures 35 illustrated in FIGS. 3A through 3C have the same semiconductor layer structure and have n-side electrodes N, which are disposed in the same position. The light emitting nanostructures 35 may each include an n-type GaN nanocore 35a, and a GaN/InGaN active layer 35b and a p-type GaN layer 35c sequentially disposed on a surface of the n-type GaN nanocore 35a. However, in the light emitting nanostructures 35 illustrated in FIGS. 3A through 3C, contact electrodes 36 and 36' and p-side electrodes P1, P2, and P3 disposed on the contact electrodes 36 and 36' have different arrangements. Here, the contact electrodes 36 and 36' may be formed of ITO (thickness: 100 nm), and the p-side electrodes P1, P2, and P3 and the n-side electrodes N may be formed of a metal having high conductivity.

Specifically, the light emitting nanostructures 35 illustrated in FIGS. 3A through 3C were designed as stated in table 1, and the same amount of current were applied to the individual light emitting nanostructures 35 through the p-side electrodes P1, P2, and P3 and the n-side electrodes N. During these simulations, the degree of current density distribution was measured for each of the light emitting nanostructures 35.

TABLE 1

| | Height of Nanostructure (μm) | ITO Contact Electrode | | P-side Electrode | |
|---|---|---|---|---|---|
| | | Location | Width (nm) | Location | Width (nm) |
| FIG. 3A | 1.5 | Entire Region | — | Lower Region | 230 |
| FIG. 3B | 1.5 | Entire Region | — | Upper Region | 230 |
| FIG. 3C | 1.5 | Upper Region | 230 | Upper Region (Location Equivalent to That of ITO Contact Electrode) | 230 |

The degree of current density distribution in the light emitting nanostructure of FIG. 3B was similar to that in the light emitting nanostructure of FIG. 3A. That is, relatively high current density was concentrated on lower regions of the light emitting nanostructures illustrated in FIGS. 3A and 3B, while most upper regions thereof exhibited relatively low current density equal to or lower than 50% of the maximum current density.

As can be seen here, it may be difficult to expect an effect of obtaining uniform current distribution by disposing the p-side electrode on a portion of the light emitting nanostructure (e.g. the upper region thereof as illustrated in FIG. 3B) in a state in which the contact electrode is deposited on the entirety of the surface of the light emitting nanostructure.

On the other hand, as illustrated in FIG. 3C, in a case in which the ITO contact electrode 36' as well as the p-side electrode P3 was partially disposed only on the upper region of the light emitting nanostructure, the current density was uniformly distributed throughout the entirety of the light emitting nanostructure.

Figure 4A:
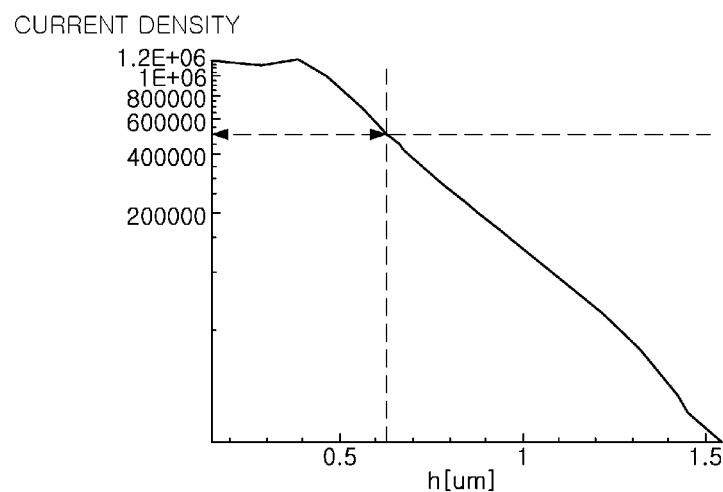
FIGS. 4A and 4B are graphs illustrating current density distribution in light emitting nanostructures having different electrode arrangements according to heights.
Figure 4B:
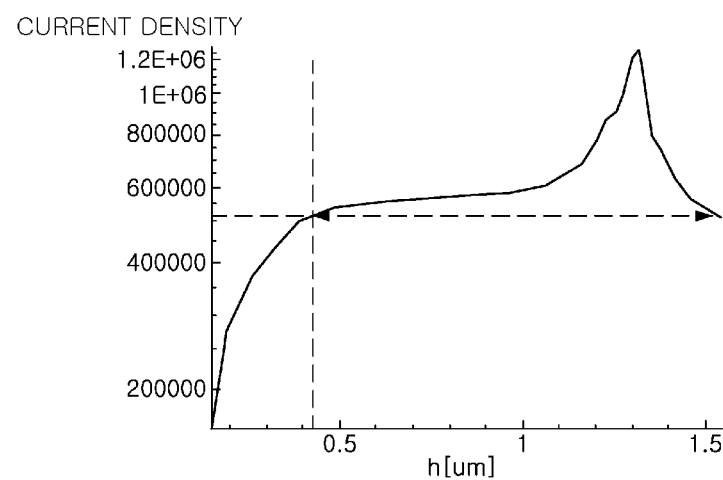

The effect of improving the current density distribution will be described in detail with reference to FIGS. 4A and 4B. FIGS. 4A and 4B are graphs illustrating current density distribution in the light emitting nanostructures of FIGS. 3B and 3C, respectively.

The current density distribution in the light emitting nanostructure of FIG. 3C illustrated in FIG. 4B may be relatively uniform as compared to the current density distribution in the light emitting nanostructure of FIG. 3B illustrated in FIG. 4A.

In the current density distribution illustrated in FIG. 4A, a region of the light emitting nanostructure having a degree of current density equal to or higher than 50% of the maximum current density merely took up approximately 40% of the entire region of the light emitting nanostructure and the degree of current density was concentrated on a lower region of the light emitting nanostructure. On the other hand, in the current density distribution illustrated in FIG. 4B, a region of the light emitting nanostructure having a degree of current density of 50% or higher of the maximum current density was increased to approximately 75% of the entire region of the light emitting nanostructure and the degree of current density was distributed in a relatively wide region of the light emitting nanostructure from an upper region to an intermediate region.

As set forth above, the contact electrode provided on the surface of the second conductivity-type semiconductor layer may be partially disposed on the upper region of the light emitting nanostructure, for example as shown in FIG. 3C, so that greater uniformity of current distribution is realized in the entire light emitting nanostructure, for example as shown in FIG. 4B.

FIGS. 5A through 5H are cross-sectional views illustrating a method of manufacturing the nanostructure semiconductor light emitting device of FIG. 1.

In the manufacturing method according to the present exemplary embodiment, the base layer 12 may initially be formed of the first conductivity-type semiconductor material.

Figure 5A:
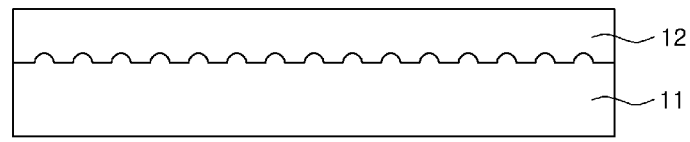
FIGS. 5A through 5H are cross-sectional views illustrating major process steps in a method of manufacturing the nanostructure semiconductor light emitting device of FIG. 1.

As illustrated in FIG. 5A, the first conductivity-type semiconductor material may be grown on the substrate 11 to form the base layer 12.

The convex pattern R (identified in FIG. 1) may be formed on the upper surface of the substrate 11. The substrate 11 may be an insulating substrate, a conductive substrate, or a semiconductor substrate, as necessary. The substrate 11 may be provided as a semiconductor growth substrate for growing the base layer 12. In the case in which the base layer 12 is formed of a nitride semiconductor, the substrate 11 formed of a material selected from sapphire, SiC, Si, MgAl$_2$O$_4$, MgO, LiAlO$_2$, LiGaO$_2$, and GaN may be used.

The base layer 12 may provide a crystal growth surface for growing the light emitting nanostructures 15 and may electrically connect one end of each of the plurality of light emitting nanostructures 15 to each other. Therefore, the base layer 12 may be formed of a semiconductor single crystal having electrical conductivity. The base layer 12 may be a crystal containing Al$_x$In$_y$Ga$_{1-x-y}$N (0≤x<1, 0≤y<1, and 0≤x+y<1).

To obtain a certain type of conductivity, the base layer 12 may be doped with n-type impurities such as silicon (Si). The base layer 12 may include GaN having an n-type impurity concentration of $1\times10^{18}$/cm$^2$ or higher. A thickness of the base layer 12 for growth of the nanocores 15a may be 1 μm or greater. In consideration of a follow-up process such as an electrode formation process or the like, the thickness of the base layer 12 may be 3 μm to 10 μm.

In the case in which the base layer 12 is grown using a nitride semiconductor single crystal, the substrate 11 may be a GaN substrate as a homogeneous substrate, or a Si substrate, a SiC substrate, or the like as a heterogeneous substrate. If necessary, a buffer layer may be provided between the substrate 11 and the base layer 12 in order to alleviate a lattice mismatch difference between layers 11 and 12. The buffer layer may be formed of Al$_x$In$_y$Ga$_{1-x-y}$N (0≤x≤1 and 0≤y≤1), especially, gallium nitride (GaN), aluminum nitride (AlN), aluminum gallium nitride (AlGaN), indium gallium nitride (InGaN), or indium gallium aluminum nitride (InGaAlN). The buffer layer may be used by combining (e.g., stacking) a plurality of layers having different compositions, or by gradually changing a composition of the buffer layer at different depths of the buffer layer.

In the case in which the substrate 11 is a Si substrate, cracking or warpage may occur due to a difference in thermal expansion coefficients between the GaN layer and the Si substrate or the possibility of defects may increase due to a lattice constant mismatch therebetween. In order to control stress for suppressing the warpage as well as controlling the occurrence of defects, a multilayer buffer structure may be used. For example, the buffer layer may be formed on the substrate 11 using a crystal not including gallium (Ga), such as AlN or SiC, in order to prevent a reaction between silicon (Si) and gallium (Ga), and an AlGaN intermediate layer may be interposed between the AlN buffer layer and the GaN layer in order to control stress.

The substrate 11 may be fully or partially removed or patterned during a chip manufacturing process in order to enhance optical or electrical characteristics of an LED chip before or after a light emitting structure is grown. For example, a sapphire substrate may be separated by irradiating a laser beam on an interface between the substrate 11 and the base layer 12, and a Si substrate or a SiC substrate may be removed through polishing, etching, and the like.

In removing the substrate 11 (e.g., after removing the substrate 11), a support substrate may be used to support the LED structure. In order to enhance luminous efficiency of the LED chip, the support substrate may be bonded by using a reflective metal or a reflective structure may be inserted into a bonding system.

The substrate 11 used in the present exemplary embodiment is illustrated as having the hemispherical convex pattern R, but the substrate 11 may be patterned in various manners. For example, an uneven pattern or an inclined surface may be formed on a lower surface or a side surface of the substrate as well as the upper surface of the substrate, before or after the growth of the single crystal, thereby improving light extraction efficiency and crystallinity. Such a pattern may have a feature size of 50 nm to 500 nm, and may be formed in a regular or irregular manner. In addition, the shape of the pattern may be varied, such as a cylindrical pattern, a prismic pattern, or a ridge pattern, besides the hemispherical pattern.

Figure 5B:
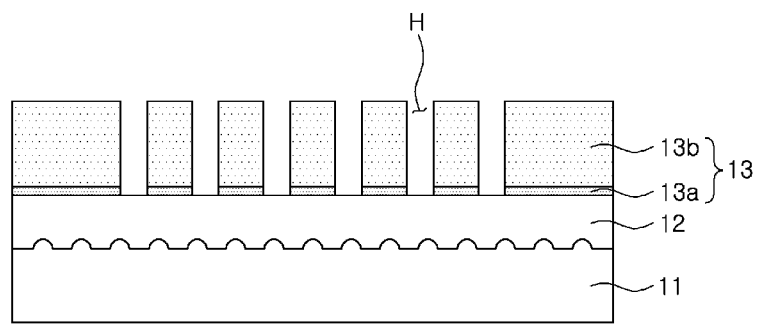

Next, as illustrated in FIG. 5B, a mask 13 having a plurality of openings H and including an etching stop layer disposed therein may be formed on the base layer 12.

The mask 13 used in the present exemplary embodiment may include a first material layer 13a formed on the base layer 12, and a second material layer 13b formed on the first material layer 13a and having an etching rate higher than that of the first material layer 13a.

The first material layer 13a may be provided as the etching stop layer with respect to the second material layer 13b. That is, the first material layer 13a may have an etching rate lower than that of the second material layer 13b under the same etching conditions.

At least the first material layer 13a may be formed of a material having electrical insulating properties, and the second material layer 13b may also be formed of an insulating material as necessary. The first and second material layers 13a and 13b may be formed of different materials to obtain a difference in etching rates. For example, the first material layer 13a may be a SiN layer, and the second material layer 13b may be a SiO$_2$ layer.

Alternatively, such a difference in the etching rates may be obtained using pore density. By forming the second material layer 13b or the first and second material layers 13a and 13b using a porous material, a difference in porosity may be adjusted to obtain a difference in the etching rates of the first and second material layers 13a and 13b. In this case, the first and second material layers 13a and 13b may be formed of the same material having different porosities. For example, the first material layer 13a may be a SiO$_2$ layer having a first porosity, and the second material layer 13b may be a SiO$_2$ layer having a second porosity higher than the first porosity. Accordingly, the etching rate of the first material layer 13a may be lower than that of the second material layer 13b under conditions under which the second material layer 13b is etched.

An overall thickness of the first and second material layers 13a and 13b may be designed in consideration of a desired height of a nanostructure. The first material layer 13a may be thinner than the second material layer 13b. An etching stop level set by the first material layer 13a may be lower than ⅓ of an overall thickness of the mask 13 from the surface of the base layer 12. In other words, the thickness of the first material layer 13a may be less than ⅓ of the overall thickness of the first and second material layers 13a and 13b.

The overall thickness of the mask 13, i.e., the overall thickness of the first and second material layers 13a and 13b, may be 1 μm or greater, preferably, 5 μm to 10 μm. The thickness of the first material layer 13a may be 0.5 μm or less.

After the first and second material layers 13a and 13b are sequentially formed on the base layer 12, the plurality of openings H may be formed in the first and second material layers to expose regions of the base layer 12 therethrough (see FIG. 5B). The size of each opening H exposing the surface of the base layer 12 may be designed in consideration of a desired size of the light emitting nanostructure. For example, a width (diameter) of the opening H may be 300 nm or less, or may be 50 nm to 500 nm.

The openings H may be formed using a semiconductor process such as a photolithography process. For example, the openings H may be formed to have a relatively high aspect ratio through a deep-etching process. The aspect ratio of the opening H may be 3:1 or higher, 5:1 or higher, or 10:1 or higher.

In general, a dry etching process is used as the deep-etching process, and reactive ions generated from plasma or ion beams generated in high vacuum may be used. Compared to wet etching, such dry etching allows for precision machining of a micro-structure without geometric constraints. A fluorocarbon or CF-based gas may be used for oxide film etching of the mask 13. For example, an etchant obtained by combining at least one of $O_2$ and Ar with a gas such as $CF_4$, $C_2F_6$, $C_3F_8$, $C_4F_8$, or $CHF_3$ may be used.

Figure 6A:
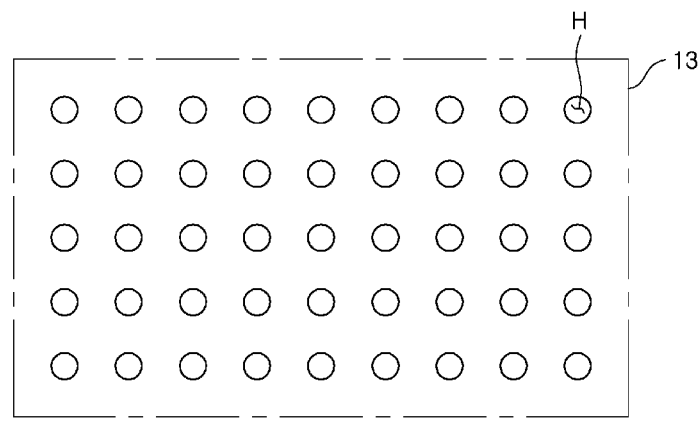
FIGS. 6A and 6B are plan views illustrating examples of a mask including openings.
Figure 6B:
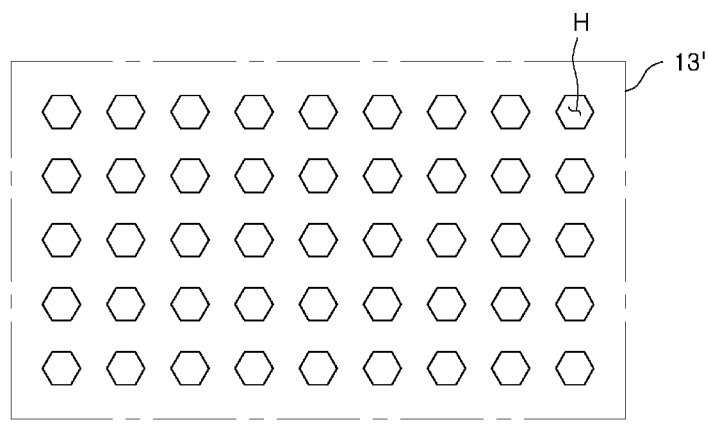

The shape and arrangement of the openings H in a plan view thereof may be variously modified. For example, the opening H may have various shapes such as a polygonal shape, a quadrangular shape, an elliptical shape, or a circular shape. The mask 13 illustrated in FIG. 5B may have an array of openings H having a circular shape as illustrated in FIG. 6A, but the mask may have different shapes and arrangements as necessary. For example, the mask may have an array of openings having a hexagonal shape, like a mask 13' as illustrated in FIG. 6B.

The openings H may have a rod structure as illustrated in FIG. 5B, but are not limited thereto. The openings H may have various structures formed through an appropriate etching process. The shapes of the openings H may be changed according to etching conditions.

Figure 7A:
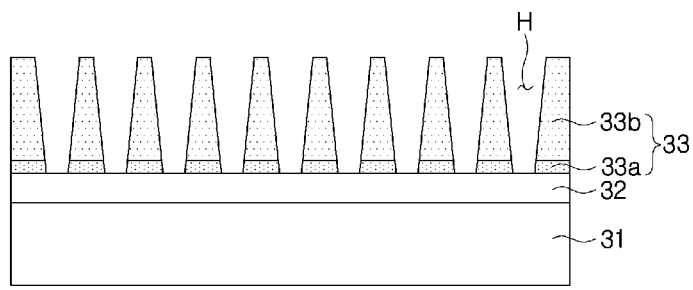
FIGS. 7A and 7B are side cross-sectional views illustrating examples of a mask including openings.
Figure 7B:
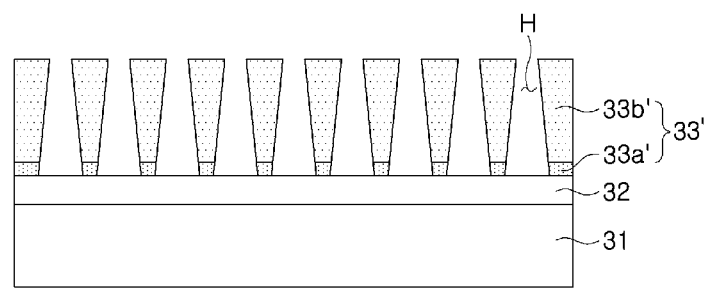

For example, masks having different shapes are illustrated in FIGS. 7A and 7B. Referring to FIG. 7A, a mask 33 including first and second material layers 33a and 33b may have openings H having a rod structure whose width is decreased toward a lower portion thereof. Referring to FIG. 7B, a mask 33' including first and second material layers 33a' and 33b' may have openings H having a rod structure whose width is increased toward a lower portion thereof.

In the present exemplary embodiment, the method of using a mold having openings corresponding to desired nanocores is taken by way of example; however, a selective growth method of using a mask (for example, a single layer having a thickness less than that of the mold) having openings may be employed.

Figure 5C:
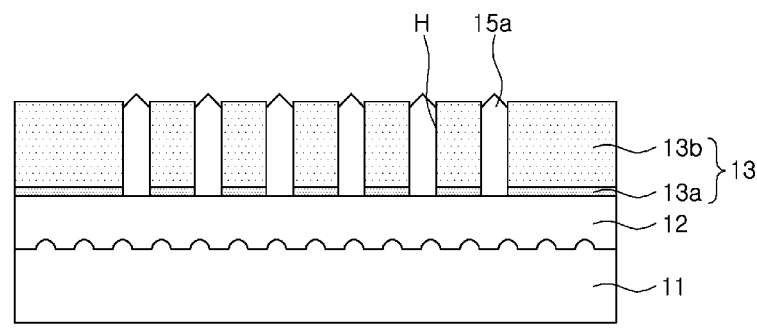

Next, as illustrated in FIG. 5C, a first conductivity-type semiconductor material may be grown on the exposed regions of the base layer 12 to fill the plurality of openings H, thus forming the plurality of nanocores 15a.

The first conductivity-type semiconductor material of the nanocores 15a may be an n-type nitride semiconductor. For example, the first conductivity-type semiconductor material may be a crystal containing n-type $Al_xIn_yGa_{1-x-y}N$ ($0 \le x < 1$, $0 \le y < 1$, and $0 \le x+y < 1$). The first conductivity-type semiconductor material forming the nanocores 15a may be identical to the first conductivity-type semiconductor material of the base layer 12. For example, the base layer 12 and the nanocores 15a may be formed of n-type GaN.

A nitride single crystal constituting the nanocore 15a may be formed using a metal-organic chemical vapor deposition (MOCVD) process or a molecular beam epitaxy (MBE) process, and in this case, the mask 13 acts as a mold for the growth of the nitride single crystal to provide the nanocore 15a corresponding to the shape of the opening H. Namely, the nitride single crystal may be selectively grown on the region of the base layer 12 exposed through the opening H of the mask 13, while filling the opening H, and thus, the shape of the grown nitride single crystal corresponds to that of the opening H.

Figure 5D:
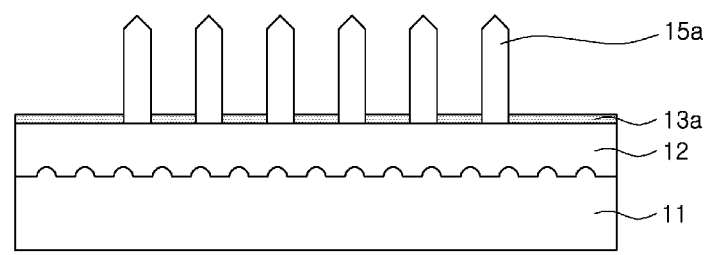

Then, as illustrated in FIG. 5D, the mask 13 may be partially removed to the level of the first material layer 13a serving as an etching stop layer to thereby expose a portion of the side surfaces of the plurality of nanocores 15a.

In the present exemplary embodiment, by using an etching process of selectively removing the second material layer 13b, only the second material layer 13b may be removed, while the first material layer 13a may be retained. The first material layer 13a may serve as the etching stop layer in the etching process, and may serve to prevent the active layer 15b and the second conductivity-type semiconductor layer 15c from being connected to the base layer 12 in a follow-up growth process.

Figure 5E:
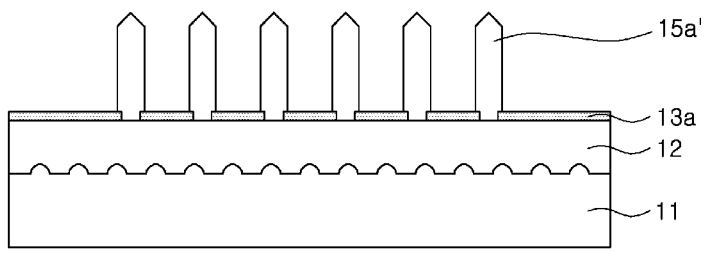

In the present exemplary embodiment, an additional heat treatment process or regrowth process may be introduced during the process of forming the light emitting nanostructures using the mask having the openings as the mold, in order to enhance crystallinity. FIG. 5E illustrates nanocores 15a' having improved surface crystallinity after being heat-treated or subjected to regrowth.

After the second material layer of the mask is removed, the surfaces of the nanocores 15a may be heat-treated or regrown under predetermined conditions to change crystal planes of the nanocores 15a into stable planes advantageous for crystal growth, like semi-polar or non-polar crystal planes. The regrowth process may be performed under conditions similar to those for growing the nanocores 15a. This process will be described with reference to FIGS. 8A and 8B.

Figure 8A:
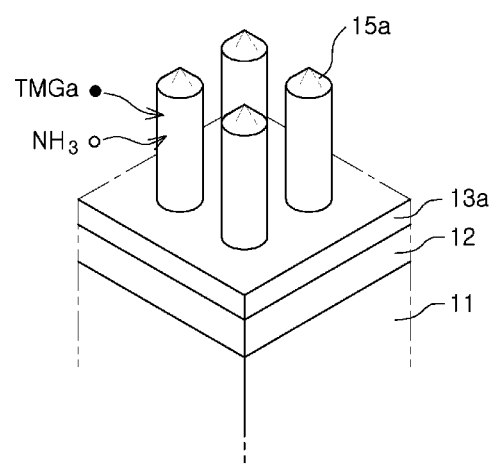
FIGS. 8A and 8B are views illustrating heat treatment or regrowth processes applicable to the exemplary embodiment of FIGS. 5D and 5E.
Figure 8B:
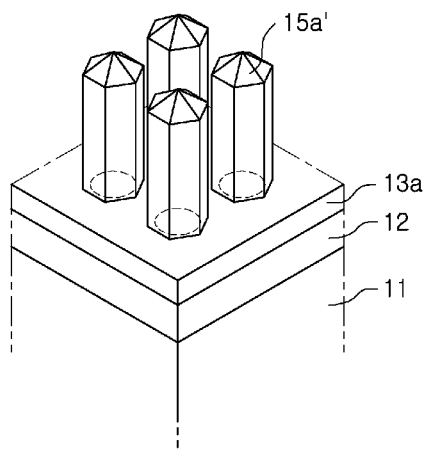

FIGS. 8A and 8B are schematic views illustrating a heat treatment or regrowth applicable to the processes of FIGS. 5D and 5E.

FIG. 8A illustrates the nanocores 15a obtained in the process of FIG. 5D. The nanocores 15a may have a family of crystal planes determined depending on the shape of the openings. Although differing depending on the shape of the openings, in general, the surfaces of the nanocores 15a thusly obtained may be relatively unstable crystal planes, which may not be advantageous for follow-up crystal growth.

In the present exemplary embodiment, when the openings have a cylindrical rod shape, the side surfaces of each nanocore 15a may be curved surfaces, rather than particular crystal planes, as illustrated in FIG. 8A.

When such nanocores 15a are heat-treated or regrowth process is performed on the surfaces of the nanocores 15a, unstable crystals on the surfaces thereof are rearranged to have stable crystal planes such as semi-polar or non-polar planes. As for heat treatment conditions, the nanocores may be heat-treated at a temperature equal to or higher than 600° C., and in a specific example, at a temperature ranging from 800° C. to 1200° C., for a few seconds to tens of minutes (1 second to 60 minutes) to obtain desired stable crystal planes.

In the heat treatment process, if the substrate temperature is lower than 600° C., it may be difficult to grow and rearrange crystals of the nanocores, causing difficulty in obtaining a heat treatment effect, and if the substrate temperature is higher than 1200° C., nitrogen (N) is evaporated from the GaN crystal planes to degrade crystallinity. Also, it may be difficult to obtain a sufficient heat treatment effect for a period of time shorter than 1 second, and a heat treatment performed for tens of minutes, for example, for a period of time longer than 60 minutes, may degrade the manufacturing process efficiency.

The regrowth process introduced in this step may be performed under conditions similar to those for growing the nanocores 15a. For example, an n-type GaN may be regrown on the surfaces of the nanocores 15a by resuming MOCVD process under conditions similar to those for growing an n-type GaN for the nanocores 15a after removing the mask.

For example, when the nanocores 15a are grown on a C (0001) plane of a sapphire substrate (a (111) plane in case of a silicon substrate), the nanocores 15a having a cylindrical shape as illustrated in FIG. 8A may be heat-treated or regrown under appropriate conditions (e.g. an appropriate temperature range) as mentioned above to cause the curved surfaces (side surfaces), which are unstable crystal planes, to change into a hexagonal crystal prism (15a' in FIG. 8B) having stable crystal planes.

It may be understood that, when crystals positioned on the surface of the nanocore 15a are rearranged at a high temperature or a source gas remains within a chamber, such a residual source gas is deposited to perform partial regrowth of stable crystal planes.

In particular, when the regrowth process is performed, as illustrated in FIG. 8A, TMGa and $NH_3$ may be supplied into an MOCVD chamber and the supplied TMGa and $NH_3$ may be reacted on the surfaces of the nanocores 15a to perform regrowth and form stable crystal planes. Due to this regrowth, widths of the regrown nanocores 15a' may be slightly increased, relative to those of the nanocores 15a prior to the regrowth process.

In this manner, crystallinity of the nanocores may be enhanced by introducing the additional heat treatment or regrowth processes. Namely, through the heat treatment and the regrowth processes, non-uniformities (for example, defects, or the like) present on the surfaces of the nanocores after the removal of the mask may be removed and crystal stability may be greatly enhanced through rearrangement of the internal crystals.

Figure 5F:
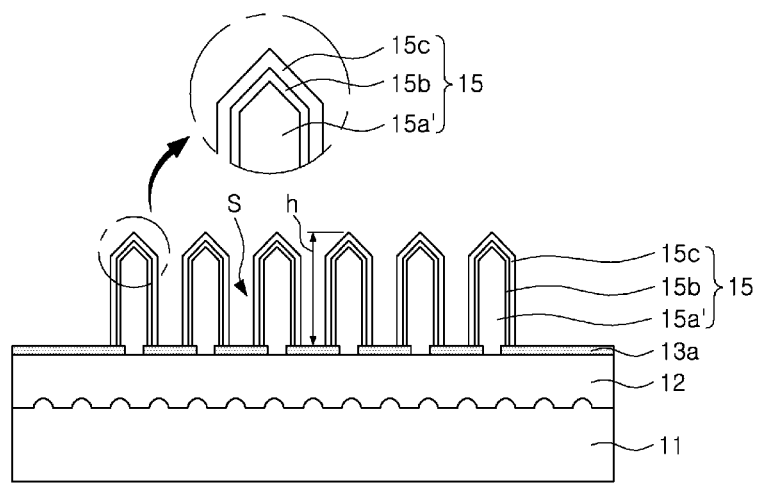

Subsequently, as illustrated in FIG. 5F, the active layer 15b and the second conductivity-type semiconductor layer 15c are sequentially grown on the surfaces of each of the plurality of nanocores 15a'.

Through this growth process, each light emitting nanostructure 15 may have a core-shell structure including the nanocore 15a' formed of the first conductivity-type semiconductor material, and a shell layer formed of the active layer 15b enclosing the nanocore 15a' and of the second conductivity-type semiconductor layer 15c enclosing the active layer 15b.

The active layer 15b may have a MQW structure in which quantum well layers and quantum barrier layers are alternately stacked. For example, in the case in which the active layer 15b is formed of a nitride semiconductor, the active layer 15b may have a GaN/InGaN or GaN/AlGaN MQW structure. As necessary, the active layer 15b may have a single quantum well (SQW) structure.

The second conductivity-type semiconductor layer 15c may be a crystal containing p-type $Al_xIn_yGa_{1-x-y}N$ ($0 \leq x < 1$, $0 \leq y < 1$, and $0 \leq x+y < 1$). The second conductivity-type semiconductor layer 15c may further include an electron blocking layer in a region adjacent to the active layer 15b. The electron blocking layer may have a plurality of laminated $Al_xIn_yGa_{1-x-y}N$ layers ($0 \leq x < 1$, $0 \leq y < 1$, and $0 \leq x+y < 1$) having different compositions or may have one or more layers including $Al_yGa_{(1-y)}N$ ($0 \leq y < 1$). The electron blocking layer has a band gap wider than that of the active layer 15b, thus preventing electrons from transferring over to the second conductivity-type (p-type) semiconductor layer 15c.

Next, the contact electrode 16 may be formed to be connected to the upper region of the second conductivity-type semiconductor layer 15c of the light emitting nanostructure 15. In the present exemplary embodiment, the insulating protective layer 17 may be divided into first and second insulating protective layers 17a and 17b and the contact electrode formation process is performed between the processes of forming the first and second insulating protective layers 17a and 17b, by way of example. These processes will be described with reference to FIGS. 5G and 5H.

Figure 5G:
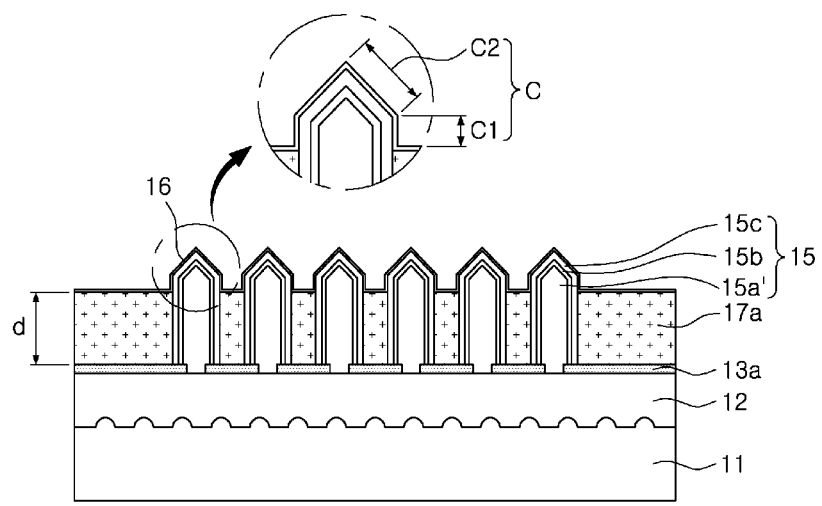

As illustrated in FIG. 5G, the first insulating protective layer 17a may be formed to fill a portion of spaces S between the plurality of light emitting nanostructures 15, and the contact electrode 16 may be formed on the first insulating protective layer 17a to be connected to the upper regions of the light emitting nanostructures 15.

The filling of the first insulating protective layer 17a may be partially performed to expose the upper regions of the light emitting nanostructures 15. The exposed regions of the light emitting nanostructures 15 may be provided as contact regions C connected to the contact electrode 16. The contact region C may be determined according to a height h of the light emitting nanostructure 15 and a thickness d of the first insulating protective layer 17a.

A distance d between the contact electrode 16 and the first material layer 13a may be equal to or greater than half of the height h of the light emitting nanostructure 15. In some embodiments, the distance d may be greater than 70% of the height h of the light emitting nanostructure 15. Relatively speaking, the contact region C may be designed to be less than half of the height h of the light emitting nanostructure 15 and to be further less than 30% of the height h of the light emitting nanostructure 15.

A method of forming the first insulating protective layer 17a may be appropriately selected according to a material used to form the layer. The first insulating protective layer 17a may be formed of an oxide or a nitride. The first insulating protective layer 17a may be formed by using a spin coating process, a reflow process, or the like, as well as a deposition process such as a chemical vapor deposition (CVD) process or a physical vapor deposition (PVD) process. In some embodiments, the first insulating protective layer 17a may be formed of TEOS, BPSG, CVD-$SiO_2$, SOG, or SOD. In other embodiments, the first insulating protective layer 17a may be formed of a polymer such as an epoxy resin, a silicon resin, a polyethylene resin or a polycarbonate resin. The first insulating protective layer 17a may be formed by using various coating processes, such as spin coating and spray coating.

The contact electrode 16 may be formed by using a deposition process such as CVD or PVD. As described above, the contact electrode 16 may be formed of an ohmic-contact material making ohmic-contact with the second conductivity-type semiconductor layer 15c. For example, the contact electrode 16 may include at least one of Ag, Ni, Al, Rh, Pd, Ir, Ru, Mg, Zn, Pt, and Au, and may have a single layer structure or a multilayer structure. The contact electrode 16 may be formed of a transparent conductive material. For example, the contact electrode 16 may include at least one selected from the group consisting of ITO, ZITO, ZIO, GIO, ZTO, FTO, AZO, GZO, $In_4Sn_3O_{12}$ and $Zn_{(1-x)}Mg_xO$ ($0 \leq x \leq 1$). As necessary, the contact electrode 16 may include graphene.

Meanwhile, the structure of the light emitting nanostructure 15 according to the present exemplary embodiment may be partially modified in order to prevent leakage current and improve light extraction efficiency. In the partial modification, the contact electrode may only be formed on a side contact region C1 disposed on the side surfaces of the light emitting nanostructure 15 which are the first family of crystal planes. In particular, in the partial modification, the contact electrode is not formed directly on a top contact region C2 disposed on the tip portion of the light emitting nanostructure 15 having the second family of crystal planes different from the first family of crystal planes. Instead, for example, a current blocking intermediate layer formed of a high resistance element may be provided on the tip portion of the light emitting nanostructure 15 (see FIG. 10A), or a portion of the contact electrode may be removed from the top contact region C2 (see FIG. 10B), whereby the flow of current may be suppressed in the tip portion of the light emitting nanostructure 15.

Figure 5H:
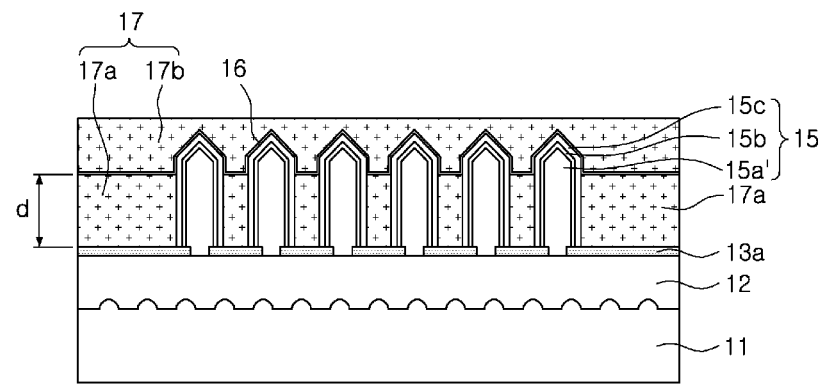

Subsequently, as illustrated in FIG. 5H, the second insulating protective layer 17b may be formed on the contact electrode 16.

The second insulating protective layer 17b may be formed by filling a remaining portion of the spaces between the plurality of light emitting nanostructures 15, while encapsulating the plurality of light emitting nanostructures 15. The second insulating protective layer 17b together with the first insulating protective layer 17a may form the insulating protective layer 17 having a passivation structure.

The second insulating protective layer 17b may be formed of a material similar to that of the first insulating protective layer 17a. A method of forming the second insulating protective layer 17b may also be appropriately selected according to used material. For example, the second insulating protective layer 17b may be formed of an oxide or a nitride, and may be formed by using a deposition process such as a CVD process or a PVD process or an application process such as a spin coating process, a reflow process, or the like. In some embodiments, the second insulating protective layer 17b may be formed of TEOS, BPSG, CVD-SiO$_2$, SOG, or SOD. In other embodiments, the first insulating protective layer 17a may be formed of a polymer such as an epoxy resin, a silicon resin, a polyethylene resin, or a polycarbonate resin.

Unlike the present exemplary embodiment, the second insulating protective layer 17b may not be provided in other embodiments. For example, the contact electrode may be formed as a thick film to fill the spaces between the light emitting nanostructures (see FIG. 13).

FIGS. 9A through 9D are cross-sectional views illustrating sequential processes in forming light emitting nanostructures 45 using a mask 43 substantially similar to the mask 33 illustrated in FIG. 7A. In this exemplary embodiment, a current blocking intermediate layer may be employed on a tip portion of a light emitting nanostructure in order to suppress leakage current.

Figure 9A:
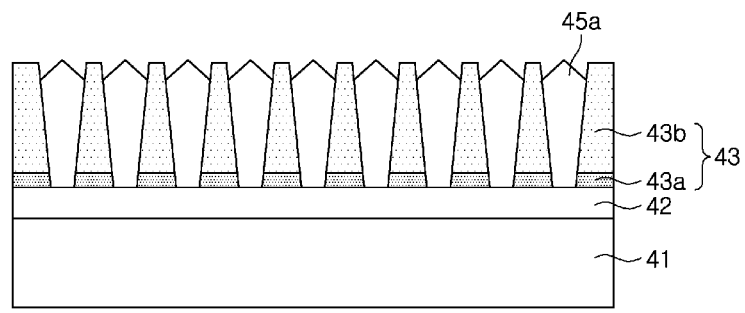
FIGS. 9A through 9D are cross-sectional views illustrating sequential processes in forming nanocores using the mask of FIG. 7A.

As illustrated in FIG. 9A, nanocores 45a may be grown on a base layer 42 using a mask 43. The mask 43 may have openings H, each of which has a width decreasing toward a lower portion thereof (i.e., toward a portion of the openings that is promixate to the base layer 42). Each nanocore 45a may be grown to have a shape corresponding to that of the opening H.

In order to further enhance crystallinity of the nanocores 45a, a heat treatment process may be performed one or more times during the growth of the nanocores 45a. In particular, surfaces of a tip portion of each nanocore 45a may be rearranged to be hexagonal pyramidal crystal planes, thus obtaining a stable crystal structure and guaranteeing high quality of a crystal grown in a follow-up process.

The heat treatment process may be performed under the temperature condition as described above. For example, for process convenience, the heat treatment process may be performed at a temperature equal or similar to the growth temperature of the nanocores 45a. Also, the heat treatment process may be performed while stopping supply of a metal source such as TMGa, while maintaining a pressure and a temperature equal or similar to the growth pressure and temperature of the nanocores 45a under NH$_3$ atmosphere. The heat treatment process may be continued for a few seconds to tens of minutes (for example, 5 seconds to 30 minutes), but a sufficient effect may be obtained even with a time duration ranging from approximately 10 seconds to 60 seconds.

The heat treatment process introduced during the growth process of the nanocores 45a may prevent degradation of crystallinity that may be caused when the nanocores 45a are grown at a fast speed, and thus, fast crystal growth and excellent crystallinity may be promoted.

A time period during which a heat treatment process is performed and the number of heat treatment processes used for stabilization may be variously modified according to heights and diameters of resultant nanocores. For example, in a case in which a width of each opening ranges from 300 nm to 400 nm and a height of each opening (thickness of the mask) is approximately 2.0 μm, a stabilization time duration ranging from approximately 10 seconds to 60 seconds may be inserted in a middle point, i.e., approximately 1.0 μm to grow nanocores having a desired degree of quality. The stabilization process may be omitted according to core growth conditions.

Figure 9B:
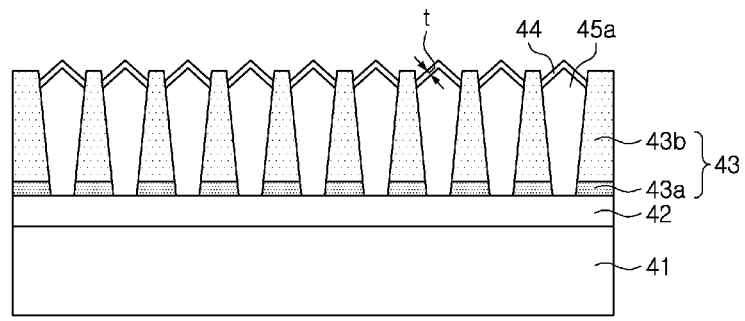

Subsequently, as illustrated in FIG. 9B, a current blocking intermediate layer 44 may be formed on the tip portions of the nanocores 45a.

After the nanocores 45a are formed to have a desired height, the current blocking intermediate layer 44 may be formed on the surfaces of the tip portions of the nanocores 45a with the mask 43 retained. Thus, since the mask 43 is used as is, the current blocking intermediate layer 44 may be easily formed on the desired regions (the surfaces of the tip portions) of the nanocores 45a without forming an additional mask.

The current blocking intermediate layer 44 may be a semiconductor layer not doped intentionally or may be a semiconductor layer doped with a second conductivity-type impurity different from that of the nanocores 45a. For example, in a case in which the nanocores 45a are formed of n-type GaN, the current blocking intermediate layer 44 may be an undoped GaN layer or a GaN layer doped with magnesium (Mg) as a p-type impurity. In this case, by changing types of impurity during the same growth process, the nanocores 45a and the current blocking intermediate layer 44 may be consecutively formed. For example, in case of stopping silicon (Si) doping, and then injecting magnesium (Mg) and growing the same for approximately 1 minute under the same conditions as those of the growth of the n-type GaN nanocores, the current blocking intermediate layer 44 having a thickness ranging from approximately 200 nm to 300 nm may be formed, and such a current blocking intermediate layer 44 may effectively block a leakage current of a few μA or higher. In this manner, the current blocking intermediate layer may be simply formed during the mold-type process as in the present exemplary embodiment.

Figure 9C:
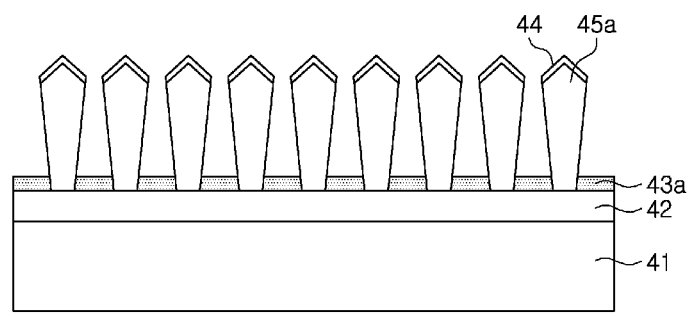

Subsequently, as illustrated in FIG. 9C, the mask 43 may be partially removed to the level of a first material layer 43a serving as an etching stop layer to thereby expose a portion of the side surfaces of the plurality of nanocores 45a.

In the present exemplary embodiment, by using an etching process of selectively removing a second material layer 43b, only the second material layer 43b may be removed, while the first material layer 43a may be retained. The residual first material layer 43a may serve to prevent an active layer and a second conductivity-type semiconductor layer from being connected to the base layer 42 in a follow-up growth process.

In the present exemplary embodiment, an additional heat treatment process may be introduced during the process of forming the light emitting nanostructures using the mask having the openings as the mold in order to enhance crystallinity.

After the second material layer 43b of the mask 43 is removed, a regrowth procedure may be performed on the surfaces of the nanocores 45a to change unstable crystal planes of the nanocores 45a into stable crystal planes (e.g., refer to FIGS. 8A and 8B for further detail). The regrowth procedure may be performed under conditions similar to those for growing the nanocores 45a. For example, an n-type GaN may be regrown on the surfaces of the nanocores 45a by using MOCVD process under conditions similar to those for growing an n-type GaN for the nanocores 45a.

Figure 9D:
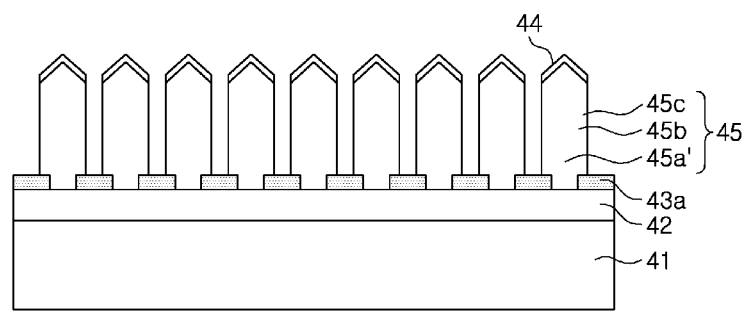

In particular, in the present exemplary embodiment, the nanocores 45a are grown on the openings having inclined side walls, such that they have inclined side walls corresponding to the shapes of the openings. However, as illustrated in FIG. 9D, after the regrowth procedure is performed, crystals are rearranged and regrown, so that nanocores 45a' may have a substantially uniform diameter (or width). Also, the tip portions of the nanocores 45a immediately after being grown may have an incomplete hexagonal pyramidal shape, while those of the nanocores 45a' after the regrowth process may have a hexagonal pyramidal shape having uniform facets. After the removal of the mask, the nanocores 45a having a non-uniform width may be regrown (and rearranged) to form the nanocores 45a' having a hexagonal prism structure having a uniform width and stable crystal planes through the regrowth process.

Figure 10A:
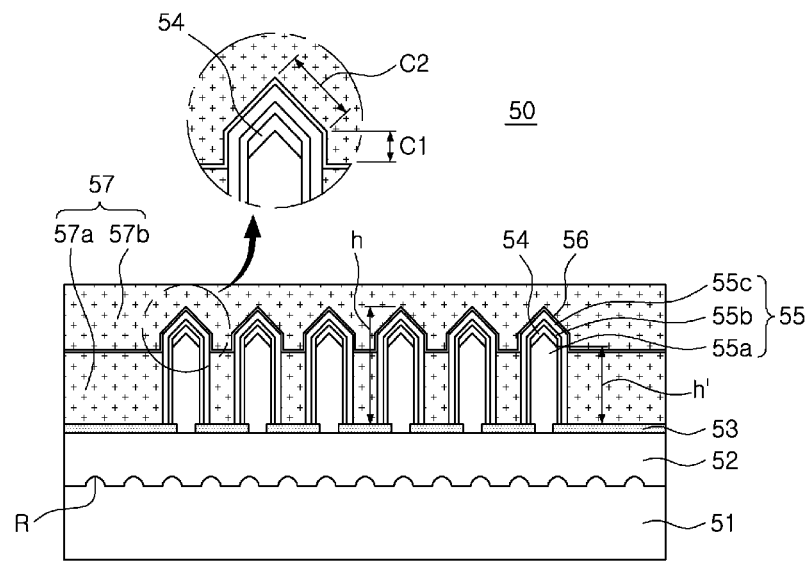
FIGS. 10A through 10C are cross-sectional views of nanostructure semiconductor light emitting devices according to various alternative exemplary embodiments of the present disclosure.
Figure 10B:
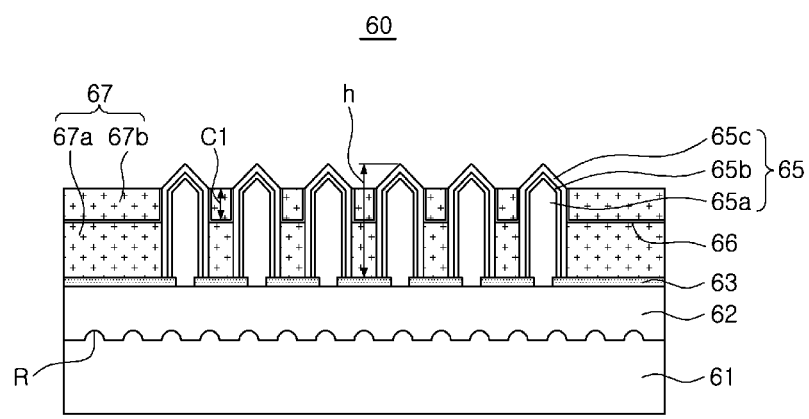
Figure 10C:
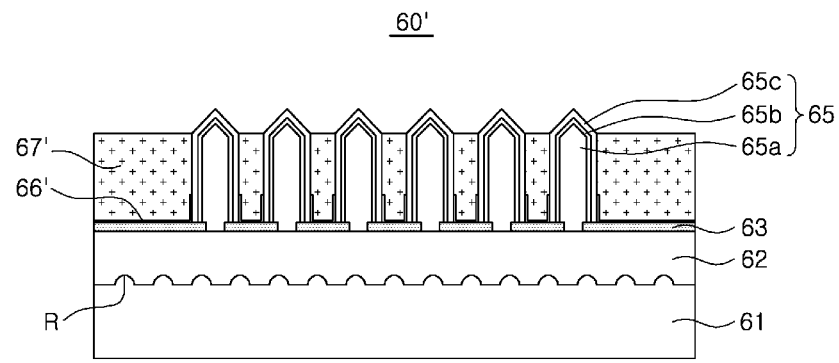

FIGS. 10A through 10C are cross-sectional views of nanostructure semiconductor light emitting devices according to exemplary embodiments of the present disclosure, which are examples for preventing leakage current and/or improving light extraction efficiency.

Similarly to the embodiment of FIG. 1, a nanostructure semiconductor light emitting device 50 according to the present exemplary embodiment may include a base layer 52 formed of a first conductivity-type semiconductor material, and a plurality of light emitting nanostructures 55 disposed on the base layer 52, as illustrated in FIG. 10A. In addition, the nanostructure semiconductor light emitting device 50 may include a substrate 51 having an upper surface on which the base layer 52 is disposed.

Descriptions of the exemplary embodiment of FIG. 1 may be combined with descriptions of the present exemplary embodiment, unless otherwise mentioned. A convex pattern R may be formed on the upper surface of the substrate 51. The convex pattern R may improve light extraction efficiency and the quality of a single crystal. The base layer 52 may provide a growth surface for the light emitting nanostructures 55. The base layer 52 may be formed of a nitride semiconductor containing $Al_xIn_yGa_{1-x-y}N$ ($0 \leq x<1$, $0 \leq y<1$, and $0 \leq x+y<1$). For example, the base layer 52 may be doped with an n-type impurity such as Si.

An insulating layer 53 having a plurality of openings may be disposed on the base layer 52 and nanocores 55a may be formed on regions of the base layer 52 exposed through the openings of the insulating layer 53. For example, the insulating layer 13 may be formed of an insulating material such as $SiO_2$ or $SiN_x$.

The light emitting nanostructures 55 may each include the nanocore 55a formed of a first conductivity-type semiconductor, and an active layer 55b and a second conductivity-type semiconductor layer 55c sequentially formed on a surface of the nanocore 55a. The nanocore 55a may be formed of a nitride semiconductor containing $Al_xIn_yGa_{1-x-y}N$ ($0 \leq x<1$, $0 \leq y<1$, and $0 \leq x+y<1$) similar to the material of the base layer 52. For example, the nanocore 55a may be formed of n-type GaN. The active layer 55b may have an MQW structure in which quantum well layers and quantum barrier layers are alternately stacked. For example, in the case in which the active layer 55b is formed of a nitride semiconductor, it may have a GaN/InGaN MQW structure. The second conductivity-type semiconductor layer 55c may be a crystal containing p-type $Al_xIn_yGa_{1-x-y}N$ ($0 \leq x<1$, $0 \leq y<1$, and $0 \leq x+y<1$), and may be formed of a plurality of layers as necessary.

A contact electrode 56 may be disposed on a portion of the second conductivity-type semiconductor layer 55c to be spaced apart from the insulating layer 53. The contact electrode 56 used in the present exemplary embodiment may be disposed on upper regions of the light emitting nanostructures 55 to cover tip portions of the light emitting nanostructures 55.

Due to such disposition of the contact electrode 56, current may be supplied to ends of the light emitting nanostructures 55. Since the contact electrode 56 is not disposed in regions of the light emitting nanostructures 55 adjacent to the base layer 52, relatively uniform current density distribution may be obtained in the entirety of the light emitting nanostructures 55, whereby current concentration may be alleviated.

A distance d between the contact electrode 56 and the insulating layer 53 may be equal to or greater than half of a height h of the light emitting nanostructure 55, or may be greater than 70% of the height h of the light emitting nanostructure 55.

Similar to the embodiment of FIG. 1, the disposition of the contact electrode 56 may be facilitated by forming an insulating protective layer 57 to have a division between first and second insulating protective layers 57a and 57b. In this case, the distance between the contact electrode 56 and the insulating layer 53 may be determined based on a thickness of the first insulating protective layer 57a.

The light emitting nanostructure 55 used in the present exemplary embodiment may include a current blocking intermediate layer 54 disposed on a surface of the tip portion of the nanocore 55a.

The current blocking intermediate layer 54 may be a semiconductor layer not doped intentionally or may be a semiconductor layer doped with a second conductivity-type impurity different from that of the nanocores 55a. For example, in a case in which the nanocores 55a are formed of n-type GaN, the current blocking intermediate layer 54 may be an undoped GaN layer or a p-type GaN layer. In this case, by changing types of impurity during the same growth process, the nanocores 55a and the current blocking intermediate layer 54 may be consecutively formed. In this manner, the current blocking intermediate layer 54 may be easily formed during the mold-type process without an additional process of forming a mask (see, e.g., FIGS. 9A through 9D and related detailed description for further details).

By using the current blocking intermediate layer 54, a side contact region C1 disposed on the side surfaces of the light emitting nanostructure 55 which are a first family of crystal planes is only used, without using a top contact region C2 disposed on the tip portion of the light emitting nanostructure 55 having a second family of crystal planes different from the first family of crystal planes, whereby leakage current that may be generated on the tip portion of the light emitting nanostructure 55 may be effectively prevented. In the present exemplary embodiment, since the tip portion of the light emitting nanostructure 55 does not contribute to emission of light, a substantial height of the light emitting nanostructure 55 may be understood as being a height h' of a portion of the light emitting nanostructure 55 extending above the insulating layer and excluding the tip portion of the light emitting nanostructure 55. In addition, an area of the side contact region C1 may be smaller than that of the contact region illustrated in FIG. 1.

Unlike the above-described exemplary embodiment, a contact electrode 66 itself may be changed as illustrated in FIG. 10B. Even in this case, leakage current may be reduced in tip portions of light emitting nanostructures 65. Further, light extraction efficiency may also be improved through the tip portions of light emitting nanostructures 65.

Similarly to the embodiment of FIG. 10A, a nanostructure semiconductor light emitting device 60 illustrated in FIG. 10B may include a substrate 61 on which a convex pattern R is formed, a base layer 62 disposed on the substrate 61, and a plurality of light emitting nanostructures 65 disposed on the base layer 62. Descriptions of the exemplary embodiments of FIGS. 1 and 10A may be combined with descriptions of the present exemplary embodiment, unless otherwise mentioned.

An insulating layer 63 having a plurality of openings may be disposed on the base layer 62 and nanocores 65a may be formed on regions of the base layer 62 exposed through the openings of the insulating layer 63. The light emitting nanostructures 65 may each include the nanocore 65a, and an active layer 65b and a second conductivity-type semiconductor layer 65c sequentially formed on a surface of the nanocore 55a.

An insulating protective layer 67 may be divided into first and second insulating protective layers 67a and 67b, and the contact electrode 66 may be disposed therebetween.

Similarly to the contact electrode 56 illustrated in FIG. 10A, the contact electrode 66 in the present exemplary embodiment may be spaced apart from the insulating layer 63 to be disposed on portions of the second conductivity-type semiconductor layer 65c. Unlike the previous exemplary embodiment, the contact electrode 66 may not disposed on the tip portions of the light emitting nanostructures, but may be disposed on upper regions of the side surfaces of the light emitting nanostructures adjacent to the tip portion of the light emitting nanostructure.

Such disposition of the contact electrode 66 also allows current to be supplied to ends of the light emitting nanostructures 65, and thus, relatively uniform current density distribution may be obtained in the entirety of the light emitting nanostructures 65, and the leakage current may be reduced similarly to the previous exemplary embodiment. That is, according to the present exemplary embodiment, since only a side contact region C1 disposed on the side surfaces of the light emitting nanostructure 65 has the contact electrode 66 formed thereon, leakage current can be effectively prevented from flowing in the tip portion having different crystal planes from those of the side surfaces. In addition, since the tip portions of the light emitting nanostructures 65 are not covered with the contact electrode 66, a reduction in light extraction efficiency resulting from disadvantageous optical characteristics (for example, refractivity, transparency, and the like) of the contact electrode 66 may be prevented.

The contact electrode 66 according to the present exemplary embodiment may be formed using various methods. For example, after the contact electrode 66 and the second insulating protective layer 67b are formed to encapsulate the light emitting nanostructures 65 similar to the structure of FIG. 10A, an etching process may be performed to partially remove the contact electrode 66 and the second insulating protective layer 67b and expose the tip portion of the light emitting nanostructure 65. As illustrated in FIG. 10B, the light emitting nanostructure 65 may be retained almost without being etched, by adjusting an etchant and etching conditions.

Unlike the aforementioned process, the tip portion of the light emitting nanostructure 65 may be etched on purpose by changing the etchant and the etching conditions. As another process, a planarization process using mechanical/chemical polishing may be used to planarize the tip portion.

Unlike the embodiment of FIG. 10B, a contact electrode 66' may be disposed on lower regions of the light emitting nanostructures 65 as illustrated in FIG. 10C, so that light extraction efficiency may be further improved.

Similarly to the embodiment of FIG. 10B, a nanostructure semiconductor light emitting device 60' illustrated in FIG. 10C may include the substrate 61 on which the convex pattern R is formed, the base layer 62 disposed on the substrate 61, the plurality of light emitting nanostructures 65 disposed on the base layer 62, and the insulating layer 63 having the plurality of openings disposed on the base layer 62. The light emitting nanostructures 65 may each include the nanocore 65a, and the active layer 65b and the second conductivity-type semiconductor layer 65c sequentially formed on the surface of the nanocore 65a.

In the present exemplary embodiment, the contact electrode 66' may only be disposed on the lower regions of the side surfaces of the light emitting nanostructures 65 (e.g., regions of the side surfaces that is adjacent to the insulating layer 63), and thus, the upper regions of the light emitting nanostructures 65 (e.g., regions adjacent to tips of the light emitting nanostructures 65) may not be covered with the contact electrode 66'. In general, even in a case in which a contact electrode is formed of a transparent electrode material such as ITO, it has a refractive index different from that of light emitting nanostructures, and thus, light extraction efficiency may be lowered in a direction toward upper portions of the light emitting nanostructures. However, when the contact electrode 66' is only disposed on the lower regions of the side surfaces of the light emitting nanostructures 65 as in the present exemplary embodiment, light extraction efficiency may be significantly improved in a direction toward upper portions of the light emitting nanostructures 65.

In addition, light extraction efficiency may be further improved by forming an insulating protective layer 67' such that the tip portions of the light emitting nanostructures remain exposed as in the present exemplary embodiment. Alternatively, the light extraction efficiency may be improved by forming the insulating protective layer to encapsulate the light emitting nanostructures and additionally forming an uneven structure on an upper surface of the insulating protective layer.

Figure 11:
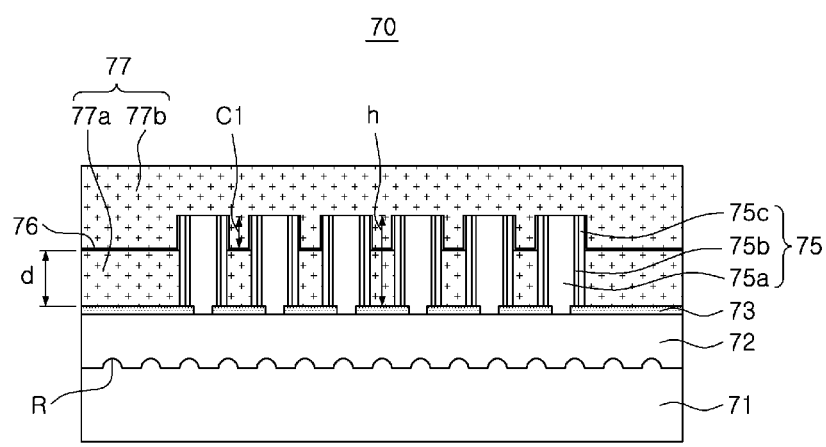
FIG. 11 is a cross-sectional view of a nanostructure semiconductor light emitting device according to an exemplary embodiment of the present disclosure.

Similarly to the previous exemplary embodiments, a nanostructure semiconductor light emitting device 70 illustrated in FIG. 11 may include a substrate 71 having a convex pattern R, a base layer 72 formed on the substrate 71, and a plurality of light emitting nanostructures 75 disposed on the base layer 72. Descriptions of the previous exemplary embodiments may be combined with descriptions of the present exemplary embodiment, unless otherwise mentioned.

An insulating layer 73 having a plurality of openings may be disposed on the base layer 72 and nanocores 75a may be formed on regions of the base layer 72 exposed through the openings of the insulating layer 73. The light emitting nanostructures 75 may each include the nanocore 75a, and an active layer 75b and a second conductivity-type semiconductor layer 75c sequentially formed on a surface of the nanocore 75a. An insulating protective layer 77 may be divided into first and second insulating protective layers 77a and 77b, and a contact electrode 76 may be disposed therebetween.

The contact electrode 76 used in the present exemplary embodiment may be spaced apart from the insulating layer 73. In addition, the light emitting nanostructures 75 may have planarized upper surfaces, on which no contact electrode 76 is disposed. The planarized upper surfaces of the light emitting nanostructures 75 may be substantially parallel to a surface of the insulating layer 73. Such a structure in the present exemplary embodiment may be obtained by performing a planarization process such as mechanical/chemical polishing after the contact electrode 76 is formed to cover the light emitting nanostructures 65.

Such disposition of the contact electrode 76 in the present exemplary embodiment also allows current to be supplied to ends of the light emitting nanostructures 75 (e.g., regions of the side surfaces of the light emitting nanostructures 75 that are adjacent to the planarized end of the nanostructures 75), and thus, relatively uniform current density distribution may be obtained in the entirety of the light emitting nanostructures 75, and leakage current generated in top portions of the light emitting nanostructures 75 may be reduced.

In addition, similarly to the exemplary embodiment of FIG. 10B, since the top portions of the light emitting nanostructures 75 are open without being covered with the contact electrode 76, a reduction in light extraction efficiency resulting from disadvantageous optical characteristics (for example, refractivity, transparency, and the like) of the contact electrode 76 may be prevented.

If necessary, upper ends of the contact electrode 76 may be additionally etched, such that they are disposed below the level of the planarized upper surface of the light emitting nanostructure. Even in this case, a distance of the contact electrode 76 from the top of the light emitting nanostructure 75 may be maintained to be less than 10% of a height of the light emitting nanostructure 75, in order to achieve the current density distribution effect through the contact electrode 76.

Figure 12A:
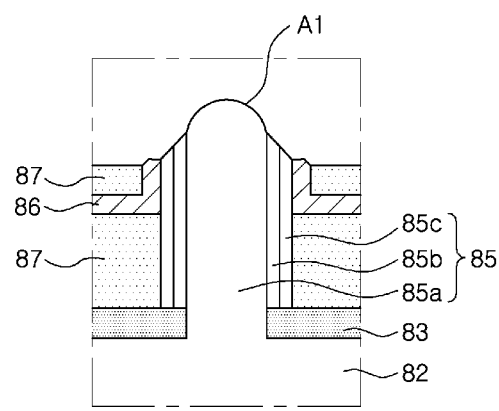
FIGS. 12A and 12B are cross-sectional views illustrating examples of light emitting nanostructures.
Figure 12B:
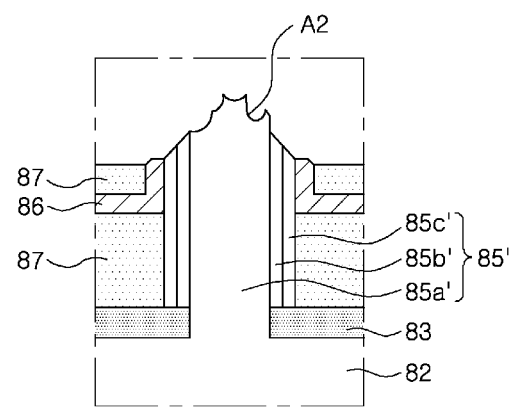

FIGS. 12A and 12B are cross-sectional views illustrating examples of light emitting nanostructures. The light emitting nanostructures illustrated in FIGS. 12A and 12B may be obtained by changing the etching process described with reference to FIG. 10B.

With reference to FIG. 12A, an insulating layer 83 having openings H may be formed on a base layer 82. A light emitting nanostructure 85 may include a nanocore 85a formed in the opening H, and an active layer 85b and a second conductivity-type semiconductor layer 85c sequentially formed on a surface of the nanocore 85a. An insulating protective layer 87 may be disposed around the light emitting nanostructure 85. A contact electrode 86 may be disposed on an upper region of the light emitting nanostructure 85, that is, on a side-surface of an upper portion of the second conductivity-type semiconductor layer 85c. The second conductivity-type semiconductor layer 85c and the active layer 85b may be partially removed from a top portion of the light emitting nanostructure 85, and a top portion of the nanocore 85a may have a convex structure A1.

For example, a first etching process of removing the insulating protective layer 87 such as spin-on-glass (SOG) to expose the top portion of the light emitting nanostructure may be performed through a CF plasma etching process, and a second etching process of removing a nitride single crystal such as ITO may be performed through an isotropic etching process using a plasma etchant in which $BCl_3$ and $Cl_2$ are mixed, whereby the convex structure A1 may be obtained.

With reference to FIG. 12B, the insulating layer 83 having the openings H may be formed on the base layer 82. A light emitting nanostructure 85' may include a nanocore 85a' formed in the opening H, and an active layer 85b' and a second conductivity-type semiconductor layer 85c' sequentially formed on a surface of the nanocore 85a'. The second conductivity-type semiconductor layer 85c' and the active layer 85b' may be partially removed from a top portion of the light emitting nanostructure 85', and a top portion of the nanocore 85a' may have an irregular surface A2.

Such a shape may be obtained by changing the plasma etchant in the second etching process. For example, it may be obtained through plasma etching using $Cl_2$ without $BCl_3$.

As described above, by adjusting the types of etchant or a mixing ratio of components of the etchant and etching conditions, the shape of the etched top portion of the light emitting nanostructure may be variously changed. In addition, the light extraction efficiency may be improved by controlling the shape of the top portion of the light emitting nanostructure.

In the previous exemplary embodiments, the insulating protective layer is divided into the first and second insulating protective layers by way of example. However, the insulating protective layer may be changed as illustrated in FIG. 13.

Figure 13:
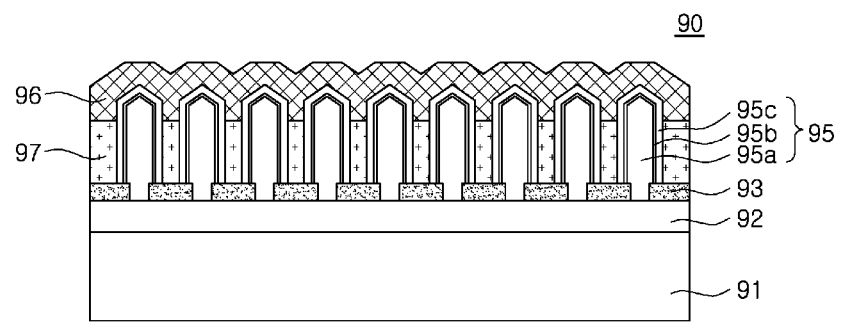
FIG. 13 is a cross-sectional view of a nanostructure semiconductor light emitting device according to an exemplary embodiment of the present disclosure.

A nanostructure semiconductor light emitting device 90 illustrated in FIG. 13 may include a substrate 91, a base layer 92 disposed on the substrate 91, and a plurality of light emitting nanostructures 95 disposed on the base layer 92. Descriptions of the previous exemplary embodiments may be combined with descriptions of the present exemplary embodiment, unless otherwise mentioned.

An insulating layer 93 having a plurality of openings may be disposed on the base layer 92 and nanocores 95a may be formed on regions of the base layer 92 exposed through the openings of the insulating layer 93. The light emitting nanostructures 95 may each include the nanocore 95a, and an active layer 95b and a second conductivity-type semiconductor layer 95c sequentially formed on a surface of the nanocore 95a.

An insulating protective layer 97 may be formed by filling a portion of spaces between the light emitting nanostructures 95. By adjusting a thickness of the insulating protective layer 97, upper regions of the light emitting nanostructures 95 may be exposed, and a contact electrode 96 may be connected to the exposed upper regions of the light emitting nanostructures 95. Unlike the previous exemplary embodiments, the contact electrode 96 used in the present exemplary embodiment may be formed as a thick film to fill a remaining portion of the spaces between the light emitting nanostructures 95.

Figure 14:
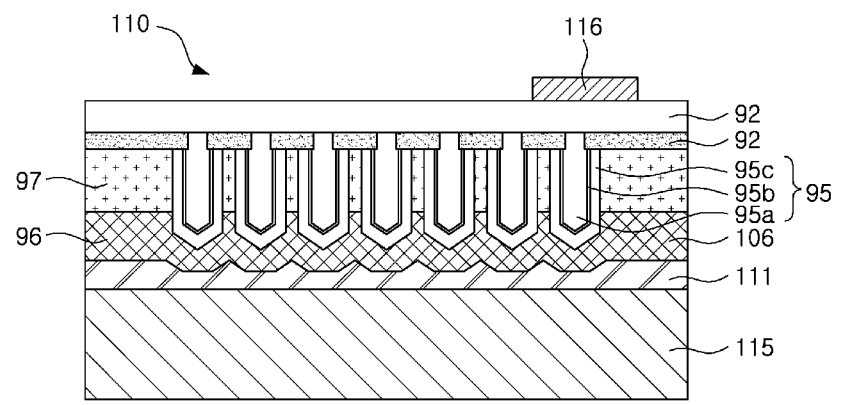
FIG. 14 illustrates the configuration of electrodes in the nanostructure semiconductor light emitting device according to the exemplary embodiment of FIG. 13.

FIG. 14 illustrates the configuration of electrodes in the nanostructure semiconductor light emitting device 90 according to the exemplary embodiment of FIG. 13.

A nanostructure semiconductor light emitting device 110 illustrated in FIG. 14 may have a structure in which the growth substrate 91 is separated from the nanostructure semiconductor light emitting device 90 of FIG. 13 and a permanent substrate 115 is bonded.

Specifically, the substrate 91 used for crystal growth in the nanostructure semiconductor light emitting device 90 of FIG. 13 may be removed from the first conductivity-type semiconductor base layer 92. This removal process may be performed using a laser lift-off process or a polishing/etching process. For example, in a case in which the substrate 91 is a sapphire substrate, the growth substrate 91 may be separated from the first conductivity-type semiconductor base layer 92 by irradiating a laser beam to an interface between the substrate 91 and the first conductivity-type semiconductor base layer 92. In a case in which the substrate 91 is an opaque substrate such as a Si substrate, the substrate 91 may be removed using the polishing/etching process.

An electrode pad 116 may be disposed on a surface of the first conductivity-type semiconductor base layer 92 from which the growth substrate 91 has been removed. In addition, the permanent substrate 115 may be a conductive substrate, which may be used as an electrode to be connected to an external circuit.

Figure 15:
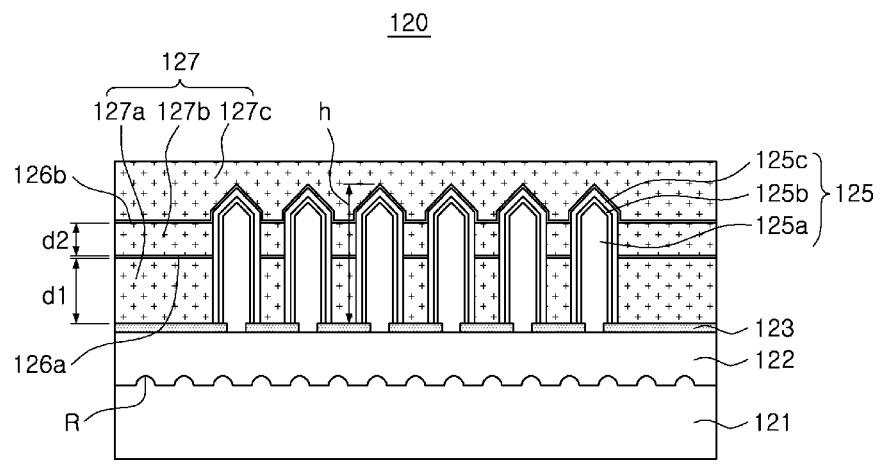
FIG. 15 is a cross-sectional view of a nanostructure semiconductor light emitting device according to an exemplary embodiment of the present disclosure.

The disposition of the contact electrode suggested in the above-described exemplary embodiment may be variously modified. The contact electrode 96 in the above-described exemplary embodiment is only disposed on the upper regions of the light emitting nanostructures; however, as necessary, an additional contact electrode may be disposed on intermediate regions of the light emitting nanostructures as illustrated in FIG. 15. Such a structure may be advantageously applied to light emitting nanostructures having a relatively high aspect ratio (for example, 10:1 or higher).

With reference to FIG. 15, a nanostructure semiconductor light emitting device 120 according to the present exemplary embodiment may include a base layer 122 formed of a first conductivity-type semiconductor material and a plurality of light emitting nanostructures 125 disposed on the base layer 122, similarly to the previous exemplary embodiments. In addition, the nanostructure semiconductor light emitting device 120 may include a substrate 121 having an upper surface on which the base layer 122 is disposed.

Descriptions of the exemplary embodiment of FIG. 1 may be combined with descriptions of the present exemplary embodiment, unless otherwise mentioned. A convex pattern R may be formed on the upper surface of the substrate 121. The convex pattern R may improve light extraction efficiency and the quality of a single crystal. The base layer 122 may provide a growth surface for the light emitting nanostructures 125. An insulating layer 123 having a plurality of openings may be disposed on the base layer 122 and nanocores 125a may be formed on regions of the base layer 122 exposed through the openings of the insulating layer 123.

The light emitting nanostructures 125 may each include the nanocore 125a formed of a first conductivity-type semiconductor material, and an active layer 125b and a second conductivity-type semiconductor layer 125c sequentially formed on a surface of the nanocore 125a.

The nanostructure semiconductor light emitting device 120 according to the present exemplary embodiment may include two contact electrodes 126a and 126b. A first contact electrode 126a may be spaced apart from the insulating layer 123 by a first distance d1 to be disposed on intermediate regions of the light emitting nanostructures 125 (e.g., regions disposed between the insulating layer 123 and the tip portions of the light emitting nanostructures 125). A second contact electrode 126b may be spaced apart from the first contact electrode 126a by a second distance d2 to be disposed to cover tip portions of the light emitting nanostructures 125.

Due to such disposition of the second contact electrode 126b, current may be supplied to ends of the light emitting nanostructures 125. In addition, an additional current path to the base layer 122 may be further formed in the intermediate regions of the light emitting nanostructures 125 through the first contact electrode 126a. Due to such disposition of the contact electrodes, in a case in which the light emitting nanostructures 125 have a relatively high aspect ratio (for example, 10:1 or higher) and the current is applied to the ends of the light emitting nanostructures 125, relatively low current density distribution may appear in the intermediate regions of the light emitting nanostructures 125. In order to address such a problem, the additional contact electrode 126a may be provided on the intermediate regions of the light emitting nanostructures 125.

Such disposition of the contact electrodes in the present exemplary embodiment may be facilitated by dividing an insulating protective layer 127 into first, second, and third insulating protective layers 127a, 127b, and 127c as illustrated in FIG. 15.

The first insulating protective layer 127a may be formed by filling a portion of spaces between the plurality of light emitting nanostructures 125, and then the first contact electrode 126a may be formed on the first insulating protective layer 127a to contact an intermediate region of the second conductivity-type semiconductor layer 125c. Here, the location of the first contact electrode 126a may be determined depending on a thickness d1 of the first insulating protective layer 127a. The second insulating protective layer 127b may be formed on the first contact electrode 126a by filling a remaining portion of the spaces between the plurality of light emitting nanostructures 125, and then the second contact electrode 126b may be formed on the second insulating protective layer 127b to contact an upper region of the second conductivity-type semiconductor layer 125c. Here, a distance between the first contact electrode 126a and the second contact electrode 126b may be determined depending on a thickness d2 of the second insulating protective layer 127b. The second contact electrode 126b may be formed to cover the tip portions of the light emitting nanostructures 125 as in the present exemplary embodiment, but is not limited thereto. As described in the previous exemplary embodiments, a surface of the tip portion of the light emitting nanostructure may be exposed or a shape thereof may be changed.

The third insulating protective layer 127c may be formed on the second contact electrode 126b by filling a remaining portion of the spaces between the plurality of light emitting nanostructures 125 to cover the plurality of light emitting nanostructures 125.

Figure 16:
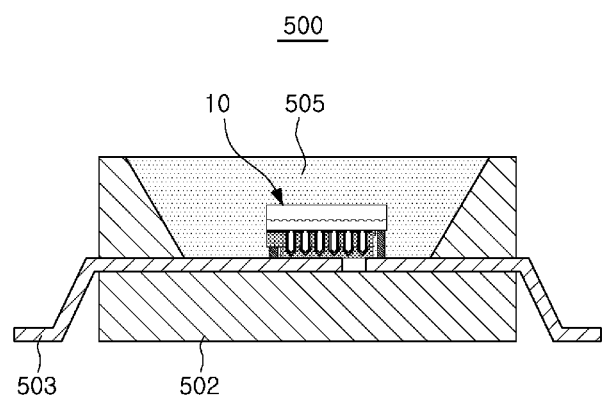
FIGS. 16 and 17 illustrate examples of a semiconductor light emitting device package including a nanostructure semiconductor light emitting device according to an exemplary embodiment of the present disclosure.
Figure 17:
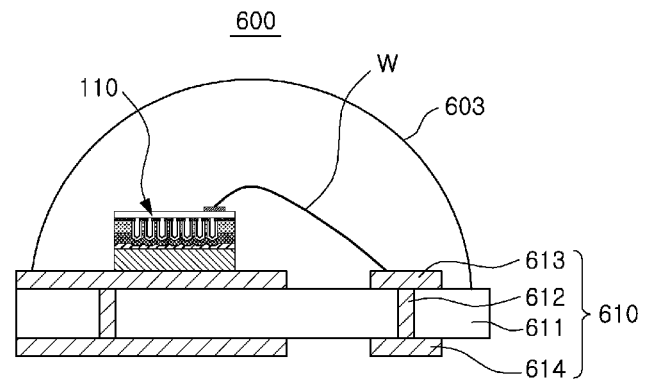

FIGS. 16 and 17 illustrate examples of a semiconductor light emitting device package including a nanostructure semiconductor light emitting device according to an exemplary embodiment of the present disclosure.

A semiconductor light emitting device package 500 illustrated in FIG. 16 may include the nanostructure semiconductor light emitting device 10 of FIG. 1, a package body 502, and a pair of lead frames 503.

The nanostructure semiconductor light emitting device 10 may be mounted on the pair of lead frames 503 and electrodes thereof may be electrically connected to the pair of lead frames 503. As necessary, the nanostructure semiconductor light emitting device 10 may be mounted on a different region, for example, on the package body 502, rather than on the pair of lead frames 503. Also, the package body 502 may have a cup shape to improve reflectivity efficiency of light. An encapsulator 505 formed of a light-transmissive material may be formed in a reflective cup to encapsulate the nanostructure semiconductor light emitting device 10, a wire, and the like.

A semiconductor light emitting device package 600 illustrated in FIG. 17 may include the nanostructure semiconductor light emitting device 110 of FIG. 14, a mounting board 610, and an encapsulator 603.

The nanostructure semiconductor light emitting device 110 may be mounted on the mounting board 610 and electrically connected to the mounting board 610 through a wire W.

The mounting board 610 may include a body 611, an upper electrode 613, a lower electrode 614, and a through electrode 612 connecting the upper electrode 613 and the lower electrode 614. The mounting board 610 may be provided as a board such as a printed circuit board (PCB), a metal core printed circuit board (MCPCB), a metal printed circuit board (MPCB), a flexible printed circuit board (FPCB), or the like, and the structure of the mounting board 610 may be modified to have various forms.

The encapsulator 603 may be formed to have a lens structure of which an upper surface has a convex dome shape. However, according to exemplary embodiments, the encapsulator 603 may have a lens structure having a convex or concave surface to adjust an angle of light emitted through the upper surface of the encapsulator 603. As necessary, a wavelength conversion material such as a phosphor, a quantum dot, or the like, may be disposed on a surface of the encapsulator 603 or the nanostructure semiconductor light emitting device 110.

The nanostructure semiconductor light emitting device and the package having the same according to the above-described exemplary embodiment may be advantageously applied to various products.

Figure 18:
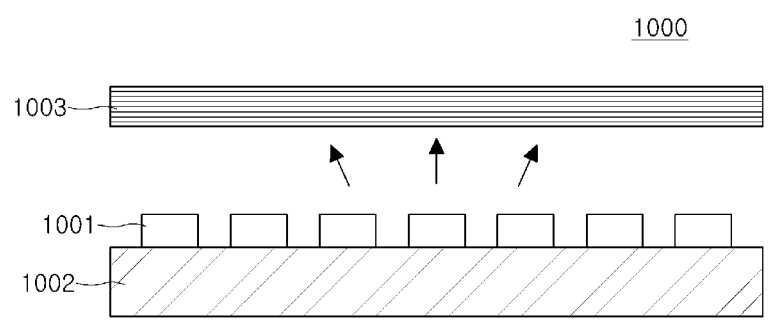
FIGS. 18 and 19 illustrate examples of a backlight unit including a nanostructure semiconductor light emitting device according to an exemplary embodiment of the present disclosure.

The nanostructure semiconductor light emitting devices according to the above-described exemplary embodiments may be used as light sources of various products. FIG. 18 through illustrate various products to which the nanostructure semiconductor light emitting device is applicable.

Figure 19:
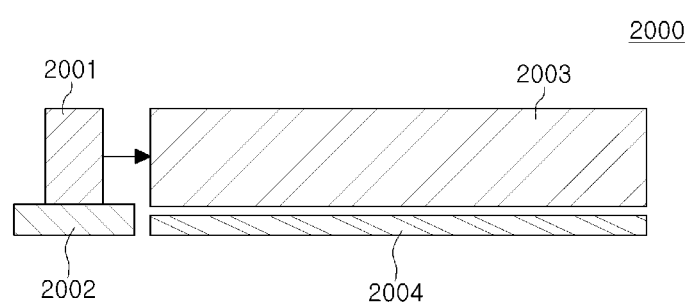

FIGS. 18 and 19 illustrate examples of a backlight unit including a nanostructure semiconductor light emitting device according to an exemplary embodiment of the present disclosure.

Referring to FIG. 18, a backlight unit 1000 may include at least one light source 1001 mounted on a substrate 1002 and at least one optical sheet 1003 disposed above the light source 1001. The aforementioned nanostructure semiconductor light emitting device or the aforementioned package having the nanostructure semiconductor light emitting device may be used as the light source 1001.

The light source 1001 in the backlight unit 1000 of FIG. 18 emits light toward a liquid crystal display (LCD) device disposed thereabove, whereas a light source 2001 mounted on a substrate 2002 in a backlight unit 2000 as another example illustrated in FIG. 19 emits light laterally, and the light is incident to a light guide plate 2003 such that the backlight unit 2000 may serve as a surface light source. The light travelling to the light guide plate 2003 may be emitted upwardly and a reflective layer 2004 may be formed below a lower surface of the light guide plate 2003 in order to improve light extraction efficiency.

Figure 20:
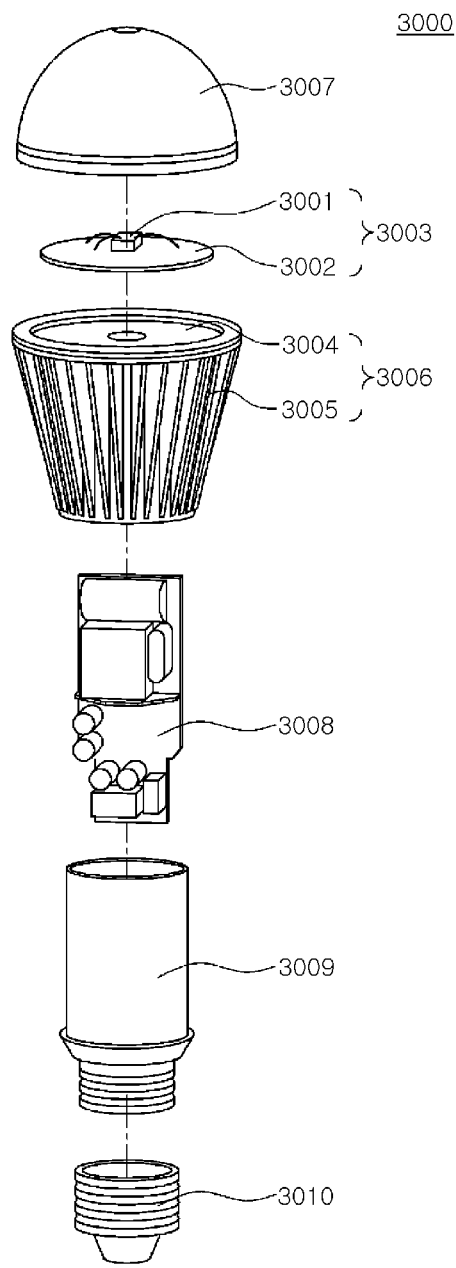
FIG. 20 illustrates an example of a lighting device including a nanostructure semiconductor light emitting device according to an exemplary embodiment of the present disclosure.

FIG. 20 is an exploded perspective view illustrating an example of a lighting device including a nanostructure semiconductor light emitting device according to an exemplary embodiment of the present disclosure.

A lighting device 3000 is illustrated, for example, as a bulb-type lamp in FIG. 20, and includes a light emitting module 3003, a driver 3008, and an external connector 3010.

In addition, the lighting device 3000 may further include exterior structures such as external and internal housings 3006 and 3009, a cover 3007, and the like. The light emitting module 3003 may include a light source 3001 that may be the aforementioned nanostructure semiconductor light emitting device or the aforementioned package having the same, and a circuit board 3002 on which the light source 3001 is mounted. For example, first and second electrodes of the nanostructure semiconductor light emitting device may be electrically connected to an electrode pattern of the circuit board 3002. In the present exemplary embodiment, a single light source 3001 is mounted on the circuit board 3002 by way of example; however, a plurality of light sources may be mounted thereon as necessary.

The external housing 3006 may serve as a heat radiator and may include a heat sink plate 3004 directly contacting the light emitting module 3003 to thereby improve heat dissipation and heat radiating fins 3005 surrounding a lateral surface of the lighting device 3000. The cover 3007 may be disposed above the light emitting module 3003 and have a convex lens shape. The driver 3008 may be disposed inside the internal housing 3009 and be connected to the external connector 3010 such as a socket structure to receive power from an external power source.

In addition, the driver 3008 may convert the received power into power appropriate for driving the light source 3001 of the light emitting module 3003 and supply the converted power thereto. For example, the driver 3008 may be configured as an AC-DC converter, a rectifying circuit part, or the like.

Figure 21:
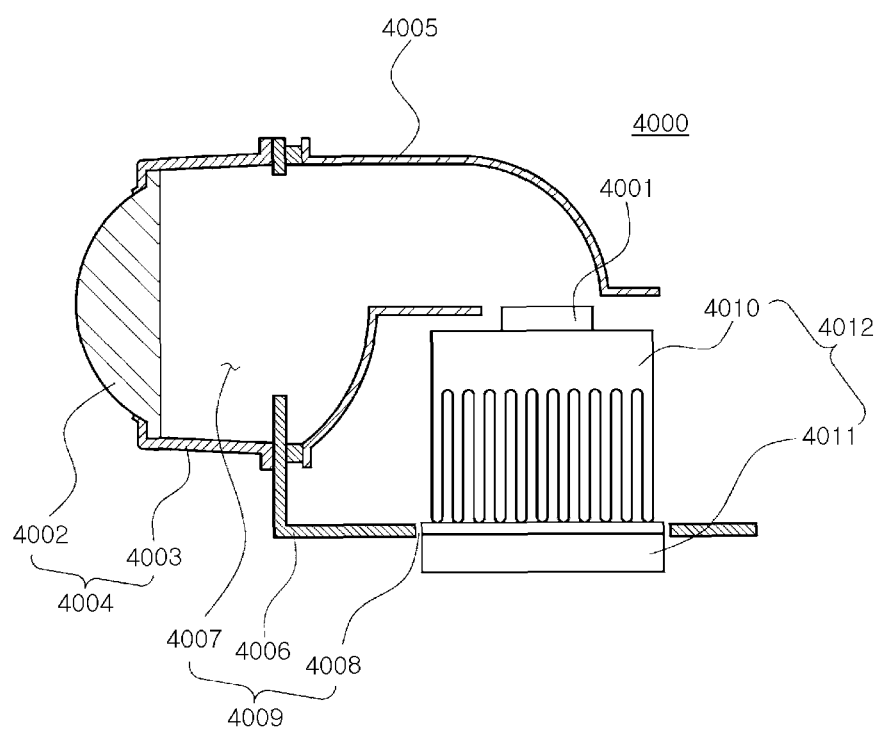
FIG. 21 illustrates an example of a headlamp including a nanostructure semiconductor light emitting device according to an exemplary embodiment of the present disclosure.

FIG. 21 illustrates an example of a headlamp including a nanostructure semiconductor light emitting device according to an exemplary embodiment of the present disclosure.

With reference to FIG. 21, a headlamp 4000 used in a vehicle or the like may include a light source 4001, a reflector 4005 and a lens cover 4004, and the lens cover 4004 may include a hollow guide part 4003 and a lens 4002. The light source 4001 may include the aforementioned nanostructure semiconductor light emitting device or the aforementioned package having the same.

The headlamp 4000 may further include a heat radiator 4012 dissipating heat generated by the light source 4001 outwardly. The heat radiator 4012 may include a heat sink 4010 and a cooling fan 4011 in order to effectively dissipate heat. In addition, the headlamp 4000 may further include a housing 4009 allowing the heat radiator 4012 and the reflector 4005 to be fixed thereto and supporting them. The housing 4009 may include a body 4006 and a central hole 4008 formed in one surface thereof, to which the heat radiator 4012 is coupled.

The housing 4009 may include a forwardly open hole 4007 formed in the other surface thereof integrally connected to one surface thereof and bent in a direction perpendicular thereto. The reflector 4005 may be fixed to the housing 4009, such that light generated by the light source 4001 may be reflected by the reflector 4005, pass through the forwardly open hole 4007, and be emitted outwardly.

As set forth above, in a nanostructure semiconductor light emitting device according to exemplary embodiments of the present disclosure, a contact electrode may be disposed on tip portions of light emitting nanostructures so that relatively uniform current density distribution is obtained in the entirety of the light emitting nanostructures having a relatively high aspect ratio, resulting in improved luminous efficiency. In addition, light extraction efficiency may be improved by adjusting shapes of the light emitting nanostructures and disposition of the contact electrode.

While exemplary embodiments have been shown and described above, it will be apparent to those skilled in the art that modifications and variations could be made without departing from the spirit and scope of the present disclosure as defined by the appended claims.

What is claimed is:

1. A core-shell structure semiconductor light emitting device, comprising:
    a base layer formed of a first conductivity-type semiconductor material;
    an insulating layer on the base layer and having a plurality of openings;
    a plurality of light emitting core-shell structures each in a separate opening of the plurality of openings, the light emitting core-shell structures being spaced apart from each other, each light emitting core-shell structure including a core formed of the first conductivity-type semiconductor material, and a separate shell including an active layer and a second conductivity-type semiconductor layer sequentially disposed on surfaces of the core; and
    a contact electrode spaced apart from the insulating layer and on a portion of the second conductivity-type semiconductor layer, the contact electrode being on at least a tip portion of each respective light emitting core-shell structure; and
    an insulating protective layer filling a continuous whole space between the plurality of light emitting core-shell structures and contacting lower regions of the plurality of light emitting core-shell structures,
    wherein the tip portion of each respective light emitting core-shell structure has crystal planes different from those on side surfaces of the respective light emitting core-shell structure.

2. The core-shell structure semiconductor light emitting device of claim 1, wherein a distance between the contact electrode and the insulating layer is greater than approximately 50% of a height of the light emitting core-shell structure measured from a surface of the insulating layer.

3. The core-shell structure semiconductor light emitting device of claim 1, wherein the light emitting core-shell structure has an aspect ratio (height:width) of 2:1 or higher where the width of the light emitting core-shell structure is measured along a surface of the insulating layer and a height of the light emitting core-shell structure is measured perpendicularly from the surface of the insulating layer.

4. The core-shell structure semiconductor light emitting device of claim 1, wherein the contact electrode is disposed to cover the tip portion of the light emitting core-shell structure.

5. The core-shell structure semiconductor light emitting device of claim 4, further comprising a current blocking intermediate layer disposed in at least one of a region between the active layer and the core and a region between the active layer and the second conductivity-type semiconductor layer to suppress a flow of current passing through the active layer in the tip portion of the light emitting core-shell structure.

6. The core-shell structure semiconductor light emitting device of claim 1, wherein the contact electrode is on the side surfaces of the light emitting core-shell structure.

7. The core-shell structure semiconductor light emitting device of claim 6, wherein the contact electrode disposed on the side surfaces of the light emitting core-shell structure is extended to a top portion of the side surfaces of the light emitting core-shell structure adjacent to the tip portion of the light emitting core-shell structure.

8. The core-shell structure semiconductor light emitting device of claim 6, wherein the contact electrode is spaced apart from the tip portion of the light emitting core-shell structure by a predetermined distance, and the predetermined distance is less than approximately 10% of a height of the light emitting core-shell structure.

9. The core-shell structure semiconductor light emitting device of claim 6, wherein the tip portion of the light emitting core-shell structure has a non-planarized surface.

10. The core-shell structure semiconductor light emitting device of claim 1, wherein the contact electrode is on the insulating protective layer.

11. The core-shell structure semiconductor light emitting device of claim 1, wherein the crystal planes on the side surfaces of the light emitting core-shell structure are perpendicular to an upper surface of the base layer.

12. The core-shell structure semiconductor light emitting device of claim 1, wherein the contact electrode comprises a plurality of contact electrodes spaced apart from one another in a height direction of the light emitting core-shell structure.

13. The core-shell structure semiconductor light emitting device of claim 12, wherein the light emitting core-shell structure has an aspect ratio (height:width) of 10:1 or higher where the width of the light emitting core-shell structure is measured along a surface of the insulating layer and a height of the light emitting core-shell structure is measured perpendicularly from the surface of the insulating layer.

14. The core-shell structure semiconductor light emitting device of claim 1, wherein the contact electrode is a thick film that fills a portion of spaces between the light emitting core-shell structures.

15. A core-shell structure semiconductor light emitting device, comprising:
    a base layer formed of a first conductivity-type semiconductor material;
    an insulating layer on the base layer and having a plurality of openings;
    a plurality of light emitting core-shell structures each in a separate opening of the plurality of openings, the light emitting core-shell structures being spaced apart from each other, each light emitting core-shell structure including a core formed of the first conductivity-type semiconductor material, and a separate shell including an active layer and a second conductivity-type semiconductor layer sequentially disposed on a surface of the core;
    a first insulating protective layer filling a lower region of a continuous space between the plurality of light emitting core-shell structures and contacting lower portions of the plurality of light emitting core-shell structures;
    a contact electrode on the first insulating protective layer and contacting a portion of the second conductivity-type semiconductor layer which is higher than half of a height of the light emitting core-shell structures the contact electrode being on at least a tip portion of each respective light emitting core-shell structure; and a second insulating protective layer filling an upper region of the continuous spaces between the plurality of light emitting core-shell structures and covering the plurality of light emitting core-shell structures, the second insulating protective layer covering the tip portion of each respective light emitting core-shell structure, the second insulating protective layer having a uniform upper surface;

wherein the lowest level of contact portions between the contact electrode and the second conductivity-type semiconductor layer is determined by a thickness at which the first insulating protective layer is formed.

16. The core-shell structure semiconductor light emitting device of claim 15, wherein the light emitting core-shell structures have planarized upper surfaces.

17. A core-shell structure semiconductor light emitting device, comprising:

a base layer formed of a first conductivity-type semiconductor material;

an insulating layer disposed on the base layer and having a plurality of openings;

a plurality of light emitting core-shell structures each in a separate opening of the plurality of openings, the light emitting core-shell structures being spaced apart from each other, each light emitting core-shell structure including a core formed of the first conductivity-type semiconductor material, and a separate shell including an active layer and a second conductivity-type semiconductor layer sequentially disposed on surfaces of the core; and a contact electrode on lower regions of side surfaces of the light emitting core-shell structures adjacent to the insulating layer, wherein the contact electrode does not cover upper regions of the light emitting core-shell structures adjacent to tips of the light emitting core-shell structures, and wherein at least upper regions of the side surfaces of the light emitting core-shell structures are exposed from the contact electrode.

18. The core-shell structure semiconductor light emitting device of claim 17, further comprising an insulating protective layer filling a space between the plurality of light emitting core-shell structures and contacting upper regions of the plurality of light emitting core-shell structures.

* * * * *